(12) United States Patent
Kuroda et al.

(10) Patent No.: US 7,622,799 B2
(45) Date of Patent: Nov. 24, 2009

(54) SEMICONDUCTOR DEVICE, INTERPOSER CHIP AND MANUFACTURING METHOD OF SEMICONDUCTOR DEVICE

(75) Inventors: Soshi Kuroda, Tokyo (JP); Naoya Yasuda, Tokyo (JP); Hideyuki Arakawa, Tokyo (JP); Akira Yamazaki, Tokyo (JP); Koji Bando, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 230 days.

(21) Appl. No.: 11/617,239

(22) Filed: Dec. 28, 2006

(65) Prior Publication Data

US 2007/0170573 A1    Jul. 26, 2007

(30) Foreign Application Priority Data

Jan. 20, 2006    (JP)    ............................. 2006-012760

(51) Int. Cl.
*H01L 23/02*    (2006.01)

(52) U.S. Cl. ...................................... 257/686; 257/777

(58) Field of Classification Search ................. 257/686, 257/777

See application file for complete search history.

(56) References Cited

U.S. PATENT DOCUMENTS

| 6,376,904 B1* | 4/2002 | Haba et al. ................... 257/686 |
| 6,538,331 B2 | 3/2003 | Masuda et al. |
| 2004/0140552 A1 | 7/2004 | Kuroda et al. |

FOREIGN PATENT DOCUMENTS

| JP | 2001217383 | 8/2001 |
| JP | 2004228323 | 8/2004 |

* cited by examiner

*Primary Examiner*—Phat X Cao
(74) *Attorney, Agent, or Firm*—Mattingly & Malur, P.C.

(57) ABSTRACT

A semiconductor device in which memory chips are stacked on the surface of a wiring substrate has a microcomputer chip and an interposer chip arranged on the surface of the memory chip. The pads of the microcomputer chip and the pads of the interposer chip are arranged almost circularly and are connected by bonding wires.

2 Claims, 19 Drawing Sheets

600μm

90μm

SEMICONDUCTOR DEVICE, INTERPOSER CHIP AND MANUFACTURING METHOD OF SEMICONDUCTOR DEVICE

CROSS-REFERENCE TO RELATED APPLICATION

The present application claims priority from Japanese patent application No. 2006-12760 filed on Jan. 20, 2006, the content of which is hereby incorporated by reference into this application.

FIELD OF THE INVENTION

This invention relates to a semiconductor device, an interposer chip, and a manufacturing method of a semiconductor device, and especially relates to a semiconductor device which stacked a chip on the surface of the wiring substrate, an interposer chip used as component parts of such a semiconductor device, and the manufacturing method of such a semiconductor device.

DESCRIPTION OF THE BACKGROUND ART

In order to aim at the realization of high-capacity of a memory, and the miniaturization of an equipment size in recent years, the semiconductor device which stacked a plurality of memory chips and a microcomputer chip on the wiring substrate and which is called SIP (System In Package) is developed. In this semiconductor device, each memory chip is connected on the surface of a wiring substrate by the flip chip system or a bonding wire system, and a microcomputer chip is connected on the surface of a wiring substrate by a bonding wire system. Each memory chip is connected to a microcomputer chip via the wiring group of a wiring substrate, and a microcomputer chip is connected to the external connection terminal group on the back surface of a wiring substrate via the wiring group of a wiring substrate (for example, refer to Patent Reference 1). It is disclosed by Patent Reference 2 about the semiconductor device which stacked a plurality of memory chips and with which the control chip which controls operation of these memory chips was stacked on them.

[Patent Reference 1] Japanese Unexamined Patent Publication No. 2004-228323

[Patent Reference 2] Japanese Unexamined Patent Publication No. 2001-217383

SUMMARY OF THE INVENTION

However, in a conventional semiconductor device, there was a problem that the bonding wire struck and taken down from the microcomputer chip to the wiring substrate contacted the electrically conductive burr exposed to the end face of a microcomputer chip, and malfunction occurred. This electrically conductive burr is generated in the manufacturing process of a microcomputer chip. That is, in the manufacturing process of a microcomputer chip, many microcomputer chips are formed in matrix form on the surface of a semiconductor wafer. And TEG (Test Element Group) for doing the monitor of the process conditions is formed in the scribe-line between microcomputer chips. When a microcomputer chip is separated, electrically conductive burrs, such as a wiring included in TEG, will remain in the end face.

Then, the semiconductor device which arranges an interposer chip on the surface of a memory chip adjoining a microcomputer chip, connects a microcomputer chip to the interposer chip via a bonding wire, and connects the interposer chip to a wiring substrate via a bonding wire was proposed (refer to Japanese Patent Application No. 2005-173357).

In this semiconductor device, since a microcomputer chip and an interposer chip adjoin and are formed in the almost same height, the bonding wire between both can be stretched above the end face of a microcomputer chip, and can be passed. Therefore, the bonding wire cannot contact the burr of the end face of a microcomputer chip easily. Since the burr is not exposed to the end face of an interposer chip, the bonding wire between an interposer chip and a wiring substrate does not contact a burr. Therefore, the generation of malfunction decreases compared with the former which was doing direct continuation of a microcomputer chip and the wiring substrate by the bonding wire.

However, when such a semiconductor device was stored in a mold and liquid resin for sealing was injected into a mold, the bonding wire deformed with the pressure into which liquid resin flows, and there was a problem that bonding wires contacted and a defective unit was generated.

There was a problem that a cross talk occurred between two signal wiring adjoined on an interposer chip.

The alignment of an interposer chip and a microcomputer chip was not easy. There was a problem that the position of an interposer chip or a microcomputer chip shifted that the adhesive strength of adhesives which pastes up between chips is too small, and a memory chip broke in manufacture that the adhesive strength of adhesives which pastes up between chips is too large.

There was a problem that the thickness of a semiconductor device was large. When a plurality of memory chips were shifted by predetermined distance and stacked so that the electrode of the end portion of a memory chip might be exposed, there was a problem that a void was made in the space between a memory chip and a wiring substrate depending on the direction which pours liquid resin for sealing, or a memory chip was removed.

When a plurality of memory chips are stacked shifting by predetermined distance so that the electrode of the end portion of a memory chip may be exposed, there was a problem that the chip of the top layer does elastic deformation and wire bonding could not be stably performed according to the load at the time of bonding when doing bonding of the wire to the electrode of the end portion of the chip of the top layer.

So, a main purpose of this invention is to offer the semiconductor device with which bonding wires cannot contact easily.

Other purposes of this invention are to offer the interposer chip in which a cross talk does not generate easily between two adjoining wirings for signals.

The purpose of further others of this invention is to offer the semiconductor device which can perform alignment of an interposer chip and other chips easily.

The further other purpose of this invention is to offer a manufacturing method of a semiconductor device which can prevent a position drift and crack of a chip.

The purpose of further others of this invention is to offer the manufacturing method of the semiconductor device which can do reduction of the thickness of a semiconductor device.

The purpose of further others of this invention is to offer the manufacturing method of the semiconductor device which can perform sealing by resin stably.

The purpose of further others of this invention is to offer the semiconductor device which can perform wire bonding stably.

A semiconductor device concerning this invention is a semiconductor device with which a first chip and a second chip were stacked over a front surface of a wiring substrate, wherein an interposer chip is formed over a front surface of the first chip, adjoining the second chip; a plurality of first electrodes are arranged along one side of a front surface of the wiring substrate; a plurality of second electrodes are arranged along one side at a side of the first electrodes of a front surface of the interposer chip; a plurality of third electrodes are arranged along one side of the interposer chip side of a front surface of the second chip; a plurality of fourth electrodes are arranged along one side which intersects perpendicularly with one side of the interposer chip side of a front surface of the second chip; along with one side of the second chip side of a front surface of the interposer chip, a plurality of fifth electrodes corresponding to the third electrodes and a plurality of sixth electrodes corresponding to the fourth electrodes are arranged; a distance between at least one fifth electrode in the fifth electrodes and one side of the second chip side of the interposer chip is longer than a distance between the each sixth electrode, and one side of the second chip side of the interposer chip; each third electrode is connected to a corresponding fifth electrode via a bonding wire; each fourth electrode is connected to a corresponding sixth electrode via a bonding wire; each fifth electrode is connected to a corresponding second electrode via a wiring of the interposer chip; each sixth electrode is connected to a corresponding second electrode via a wiring of the interposer chip; and each second electrode is connected to a corresponding first electrode via a bonding wire. Therefore, the difference of the length of the first bonding wire between at least one fifth above-mentioned electrode and the third corresponding electrode and the length of the second bonding wire between the fourth electrode and the sixth corresponding electrode can be made small. Therefore, the inflow pressure of liquid resin for sealing can be lowered by the first bonding wire, deformation of the second bonding wire can be made small, and it can prevent that the second bonding wires contact.

Another semiconductor device concerning this invention is a semiconductor device with which a first chip and a second chip were stacked over a front surface of a wiring substrate, wherein an interposer chip is formed over a front surface of the first chip, adjoining the second chip; a plurality of first electrodes are arranged along one side of a front surface of the wiring substrate; a plurality of second electrodes and a plurality of third electrodes are arranged along one side at a side of the first electrodes of a front surface of the interposer chip; along with one side of the second chip side of a front surface of the interposer chip, a plurality of fourth electrodes corresponding to the second electrodes and a fifth electrode common to the third electrodes are arranged; a plurality of sixth electrodes, and a seventh electrode for bonding options are arranged along one side of the interposer chip side of a front surface of the second chip; each sixth electrode is connected to a corresponding fourth electrode via a bonding wire; each fourth electrode is connected to a corresponding second electrode via a wiring of the interposer chip; the seventh electrode is connected to the fifth electrode via a bonding wire; the fifth electrode is connected to the third electrodes via a branching wiring of the interposer chip; each second electrode is connected to a corresponding first electrode via a bonding wire; a third electrode which was chosen among the third electrodes is connected to a corresponding first electrode via a bonding wire; and the second chip operates in a mode according to a selected third electrode. Therefore, the gap between the bonding wires between an interposer chip and the second chip can be equated. Therefore, the deformation of the bonding wire by the inflow pressure of resin for sealing can be equated, and it can prevent that bonding wires contact.

An interposer chip concerning this invention is an interposer chip with which a plurality of wirings were formed in a front surface of a substrate, wherein between two wirings for signals which adjoin of the wirings, a shielding wire for preventing a cross talk between concerning two wirings for signals is formed. Therefore, the cross talk between two adjoining signal wirings can be prevented with a shielding wire.

A manufacturing method of a semiconductor device concerning this invention is a manufacturing method of a semiconductor device which stacks a first chip and a second chip over a front surface of a wiring substrate, and manufactures a semiconductor device, wherein the first chip is mounted in a front surface of the wiring substrate; an interposer chip with which a mark for alignment was formed in a front surface is mounted over the first chip; alignment is done to the mark for alignment, and the second chip is mounted over the first chip; and between the second chip and the interposer chips is connected by a bonding wire. Therefore, since the mark for alignment was formed in the front surface of the interposer chip, alignment of an interposer chip and a microcomputer chip can be performed easily.

Another manufacturing method of a semiconductor device concerning this invention is a manufacturing method of a semiconductor device which mounts a first chip over a front surface of a wiring substrate, mounts a second chip smaller than this first chip over a front surface of the first chip, and manufactures a semiconductor device, wherein an adhesive strength of a first adhesive which pastes up between the wiring substrate and the first chip is weaker than an adhesive strength of a second adhesive which pastes up between the first and second chips. Therefore, it can be prevented that the first chip breaks or the second chip does a position drift.

Yet another manufacturing method of a semiconductor device concerning this invention is a manufacturing method of a semiconductor device which mounts a chip over a front surface of a wiring substrate, and manufactures a semiconductor device, wherein a plurality of solder resist layers are laminated over a front surface of the wiring substrate, and the chip is adhered over the front surface with an adhesive film of less than or equal to 10 µm in thickness. Therefore, compared with the former which used the adhesive film about thickness 20 µm, thickness of a semiconductor device can be made small. Since a plurality of solder resist layers are laminated on the front surface of a wiring substrate, irregularity of the front surface of a wiring substrate can be flattened.

Still another manufacturing method of a semiconductor device concerning this invention is a manufacturing method of a semiconductor device which mounts a chip over a front surface of a wiring substrate, and manufactures a semiconductor device, wherein roller rolling of a dry film resist is done over a front surface of the wiring substrate, and the chip is adhered over the front surface with an adhesive film of less than or equal to 10 µm in thickness. Therefore, compared with the former which used the adhesive film about thickness 20 µm, thickness of a semiconductor device can be made small. Since roller rolling of the dry film resist is done on the surface of a wiring substrate, irregularity of the front surface of a wiring substrate can be flattened.

Yet another manufacturing method of a semiconductor device concerning this invention is a manufacturing method of a semiconductor device which manufactures a semiconductor device with which a plurality of chips were stacked over a front surface of a wiring substrate, wherein a plurality of first electrodes are arranged along one side of the wiring substrate; a plurality of second electrodes are arranged along one side of respective chips; the chips are stacked so that the second electrodes of respective chips may be exposed, shifting predetermined distance; each second electrode is connected to a corresponding first electrode via a bonding wire; a mold which has rectangular parallelepiped-like interior space, an inlet formed in one corner of this interior space, and an exhaust port formed in a corner which faces with this inlet is prepared; and one side of the wiring substrate is turned in the same direction as one side of a bottom of the interior space, the semiconductor device is arranged in the interior space, liquid resin for sealing is injected from the inlet, and the interior space is made to fill up with and cure the liquid resin for sealing. Therefore, as big inflow pressure cannot be applied to a chip, liquid resin can be made to be able to flow into the space between a chip and a wiring substrate, and it can be prevented that a void is made in the space between a chip and a wiring substrate, or a chip is removed.

Still another semiconductor device concerning this invention is a semiconductor device with which a first-Nth (however, N is three or more integers) chips were stacked over a front surface of a wiring substrate, wherein a plurality of first electrodes are arranged along one side of the wiring substrate; a plurality of second electrodes are arranged along a side opposite to the one side of the wiring substrate; a plurality of third electrodes are arranged along each one side at the side of the first electrodes of the first to N–1th chips; the first to N–1th chips can be shifted a predetermined distance, and are stacked so that the third electrodes of the first to N–1th chip may be exposed; a plurality of fourth electrodes are arranged along one side at a side of the second electrodes of the Nth chip; the Nth chip is arranged over N–1th chip so that the Nth chip and the N–1th chip may exist at least between the fourth electrodes and a front surface of the wiring substrate; each third electrode is connected to a corresponding first electrode via a bonding wire; and each fourth electrode is connected to a corresponding second electrode via a bonding wire. Therefore, since a plurality of chips exist under a fourth electrode, when doing bonding of the wire to a fourth electrode, it can prevent that the Nth chip deforms greatly according to the load applied to a fourth electrode, and wire bonding can be performed stably.

DETAILED DESCRIPTION OF THE PREFERRED EMBODIMENTS

Embodiment 1

Figure 1:
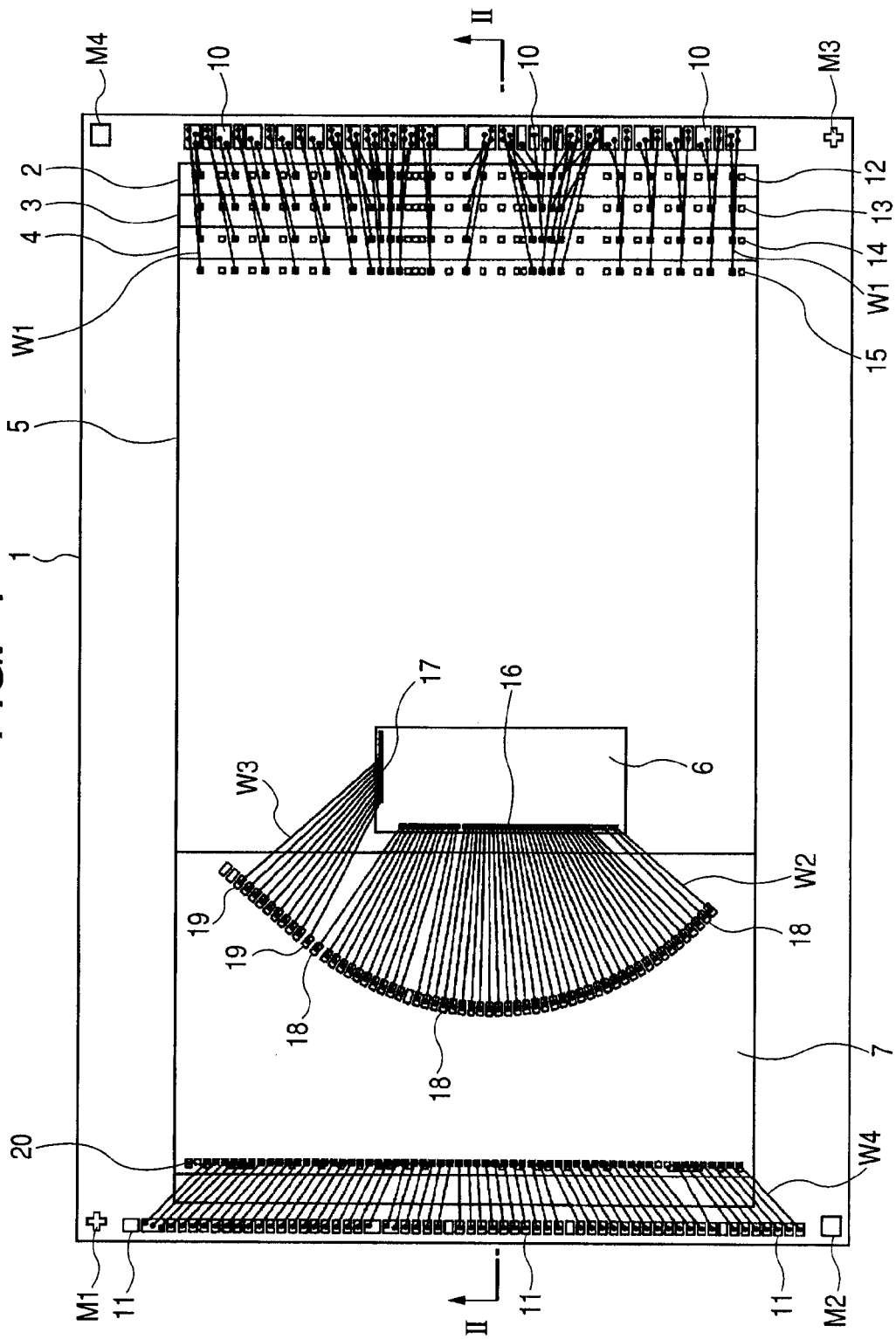
FIG. 1 is a plan view showing the structure of the semiconductor device by Embodiment 1 of this invention.
Figure 2:
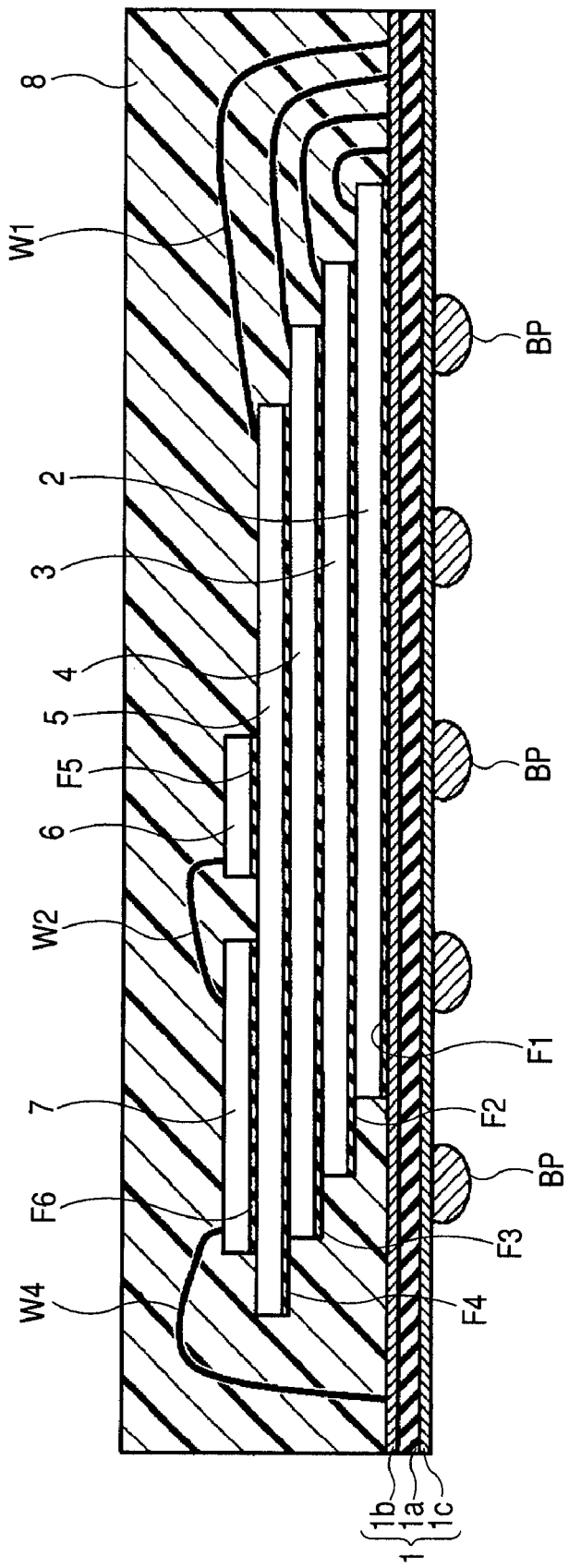
FIG. 2 is an II-II line cross-sectional view of FIG. 1.

FIG. 1 is a plan view showing the structure of the semiconductor device by this embodiment of the invention 1, and FIG. 2 is an II-II line cross-sectional view of FIG. 1. In FIG. 1 and FIG. 2, this semiconductor device is a SIP of the stack structure which stacked memory chips 2-5 of four sheets, and microcomputer chip 6 on the front surface of wiring substrate 1, mounted interposer chip 7 on the front surface of memory chip 5 adjoining microcomputer chip 6, and was sealed with mold resin 8. Wiring substrate 1, memory chips 2-5, microcomputer chip 6, and interposer chip 7 are being mutually fixed with adhesive films F1-F6.

Each of wiring substrate 1, memory chips 2-5, microcomputer chip 6, and interposer chip 7 is formed in the rectangle. A plurality of bonding pads (electrode) 10 for memory chips 2-5 and a plurality of bonding pads 11 for interposer chip 7 are formed in the front surface of wiring substrate 1. A plurality of bonding pads 10 are arranged in predetermined pitch L1 (for example, 200 μm) along the short side on the right-hand side in the drawing of wiring substrate 1. A plurality of bonding pads 11 are arranged in predetermined pitch L2 (for example, 200 μm) along the short side on the left-hand side in the drawing of wiring substrate 1. The size of wiring substrate 1 is 12×17 mm, for example.

The flash memory is formed in each of memory chips 2-5. Many memory transistors are formed in the flash memory, and each memory transistor memorizes data. As a flash memory, an AG-AND (Assist Gate-AND) type flash memory is used, for example. An AG-AND type flash memory forms the source/drain of a memory cell transistor instead of a conventional diffusion layer by the inversion layer generated in a silicon substrate when voltage is applied to an assistant gate. In an AG-AND type flash memory, since memory cell area becomes ⅔ of conventionals, the realization of high-capacity of memory space and the miniaturization of an equipment size can be aimed at. A NAND type, a NOR type, etc. are sufficient as a flash memory.

Memory chips 2-5 turn those long sides in the same direction as the long side of wiring substrate 1, and are arranged in the central part of wiring substrate 1 front surface. A plurality of bonding pads 12-15 are formed in the front surface of memory chips 2-5, respectively. A plurality of bonding pads 12-15 are arranged in predetermined pitch L3 (for example, 100 μm, L3<L1) along the short side on the right-hand side in the drawing of memory chips 2-5, respectively. Memory chips 2-5 can be shifted by prescribed distance to a long side direction, and are stacked so that bonding pads 12-15 may be exposed. Each size of memory chips 2-5 is 10×15 mm, for example. Each of memory chips 2-5 is arranged in an above position based on the picture photoed by a CCD camera on the basis of marks M1-M4 for alignment formed in the four corners of wiring substrate 1.

Each of bonding pads 12-15 is connected to corresponding bonding pad 10 by bonding wire W1. Individual bonding pad 10 is formed for bonding pads 12-15 for chip enable signal /CE of memory chips 2-5. Common bonding pad 10 is formed for bonding pads 12-15 other than for chip enable signal /CE. Therefore, bonding pads 12-15 for chip enable signal /CE of memory chips 2-5 are connected to separate bonding pad 10. Bonding pads 12-15 for signals other than for chip enable signal /CE (for example, lead enable signal /RE) are connected to the same bonding pad 10.

The interface circuitry which delivers and receives data between the flash memory formed in each of memory chips 2-5 and the outside is formed in microcomputer chip 6. Responding to the purpose of using a semiconductor device, an interface circuitry is formed according to standards, such as MMC (Multi Media Card), USB (Universal Serial Bus), SD (Secure Digital), and CF (Compact Flash). Therefore, this semiconductor device can be used as a substitute of the memory card of these standards. However, since this semiconductor device cannot be attached and detached, data is not copied detaching like a memory card. Since the card slot is unnecessary, the miniaturization of equipment can be aimed at.

Figure 3:
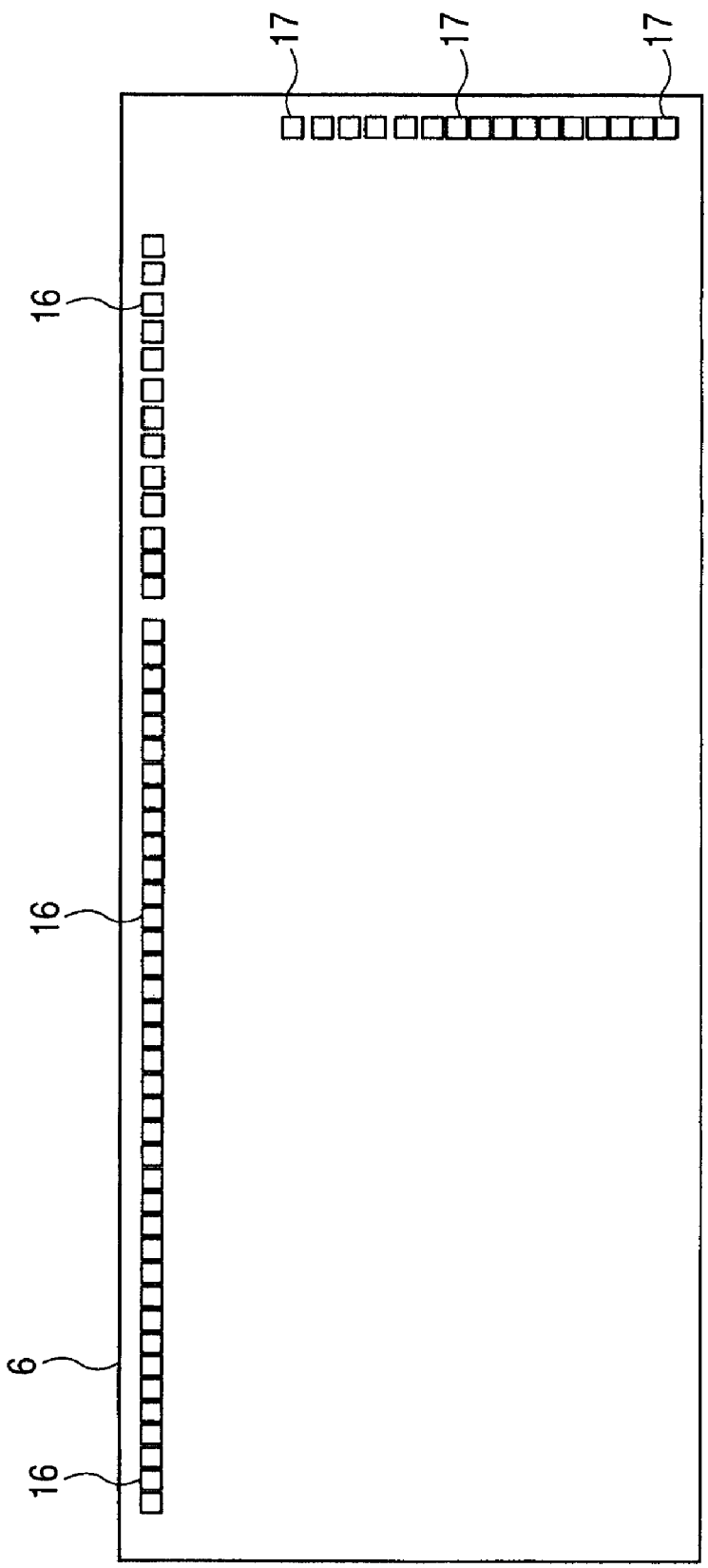
FIG. 3 is a plan view showing the structure of the microcomputer chip shown in FIG. 1.

Microcomputer chip 6 turns the long side in the same direction as the short side of wiring substrate 1, and is arranged in the central part of memory chip 5 front surface. As shown in FIG. 3, a plurality of bonding pads 16 are formed in the front surface of microcomputer chip 6 along the long side of chip 6, and a plurality of bonding pads 17 are formed in it along the short side of chip 6. A plurality of bonding pads 16 are arranged in predetermined pitch L4 (for example, 50 μm, L4<L3) along the long side on the left-hand side in FIG. 1 of microcomputer chip 6. A plurality of bonding pads 17 are arranged in predetermined pitch L4 along the short side of the upside in FIG. 1 of microcomputer chip 6. The size of microcomputer chip 6 is 2×4 mm, for example.

As shown in FIG. 1, interposer chip 7 turns the long side in the same direction as the short side of wiring substrate 1, adjoins the left-hand side in FIG. 1 of microcomputer chip 6, and is arranged on the front surface of memory chip 5. A plurality of bonding pads 18 formed corresponding to a plurality of bonding pads 16 of microcomputer chip 7, a plurality of bonding pads 19 formed corresponding to a plurality of bonding pads 17 of microcomputer chip 7, and a plurality of bonding pads 20 formed corresponding to a plurality of bonding pads 11 of wiring substrate 1 are formed on the front surface of interposer chip 7. A plurality of bonding pads 18 and 19 are arranged almost circularly in predetermined pitch L5 (for example, 100 μm, L5>L4) by using the long side of the right-hand side in the FIG. 1 of interposer chip 7 as a bow-string. A plurality of bonding pads 20 are arranged in predetermined pitch L6 (for example, 100 μm, L2>L6>L4) along the long side of the left-hand side in the FIG. 1 of interposer chip 7. The size of interposer chip 7 is 3×6 mm, for example.

Figure 4:
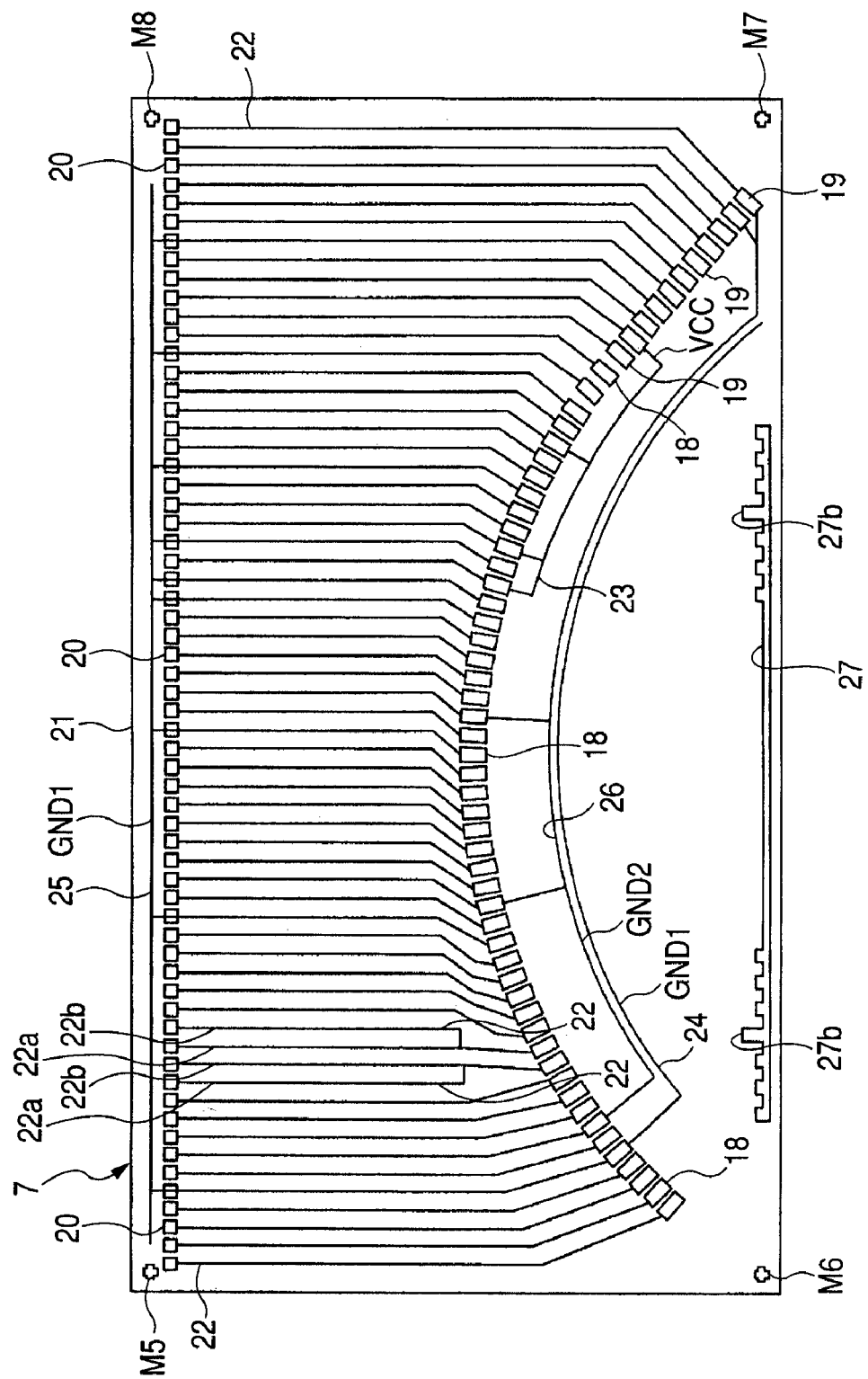
FIG. 4 is a plan view showing the structure of the interposer chip shown in FIG. 1.

Interposer chip 7 forms bonding pads 18-20, wirings 22-26, marks M5-M8 for alignment, mark 27 for visual inspection, etc. in the front surface of silicon substrate 21 by an one-layer wiring layer, as shown in FIG. 4. In Embodiment 1, although interposer chip 7 was set as the structure which has an one-layer wiring layer on silicon substrate 21, it is not restricted to this. For example, it is good also as what has a multilayer wiring layer as interposer chip 7, and structure which has passive elements, such as a bypass condenser for stabilizing the power supply of microcomputer chip 6 or memory chips 2-5, or a resistor element for a pulldown. Especially the thing for which the bypass condenser of sufficient capacity is formed on interposer chip 7 when the semiconductor device of the present invention is built into the portable electron devices driven with a battery, such as a cellular phone, is preferred when improving the reliability of feeding power. It is also possible to use it as a capacitor for stabilizing the internal electrical power source potential which pressure lowering or pressure up is done and is supplied inside microcomputer chip 6 or memory chips 2-5.

Each bonding pad 18 is connected to corresponding bonding pad 20 via wiring 22 formed in the front surface of interposer chip 7, as shown in FIG. 4. One bonding pad 18 is formed corresponding to each bonding pad 16 for the bonding options of microcomputer chip 6. Wiring 22 corresponding to the bonding pad 18 has branched to wirings 22a and 22b of plurality (FIG. 4 two) by the bonding pad 20 side. Wirings 22a and 22b are connected to two adjoining bonding pads 20. By connecting bonding pad 20 of either of the two bonding pads 20 with corresponding bonding pad 11 of wiring substrate 1 via a bonding wire, microcomputer chip 6 can be operated in one mode of the two modes. For example, it can be switched whether microcomputer chip 6 can be operated with the first supply voltage, or it can be operated with the second supply voltage.

When each bonding pad 18 is connected to bonding pad 20 via wiring 22, forming a plurality of bonding pads 18 corresponding to each bonding pad 16 for the bonding options of microcomputer chip 6 without branching wiring 22, since a bonding wire is not connected to bonding pad 18 which is not chosen of a plurality of bonding pads 18, it becomes impossible to form mostly a plurality of bonding wires between microcomputer chip 6 and interposer chip 7 at equal intervals, the deformation of a bonding wire becomes large, and bonding wires contact easily.

Each bonding pad 19 is connected to corresponding bonding pad 20 via wiring 22 formed in the front surface of interposer chip 7, as shown in FIG. 4. Common connection of a plurality of bonding pads 18 and 19 for supply voltage VCC is made at wiring 23 formed along bonding pad 18 and 19 groups. Common connection of a plurality of bonding pads 18 and 19 for ground voltage GND1 is made at wiring 24 formed along bonding pad 18 and 19 groups. Common connection of a plurality of bonding pads 20 for ground voltage GND1 is made at wiring 25 formed along bonding pad 20 group. Common connection of a plurality of bonding pads 18 and 19 for ground voltage GND2 is made at wiring 26 formed along bonding pad 18 and 19 groups.

Figure 5:
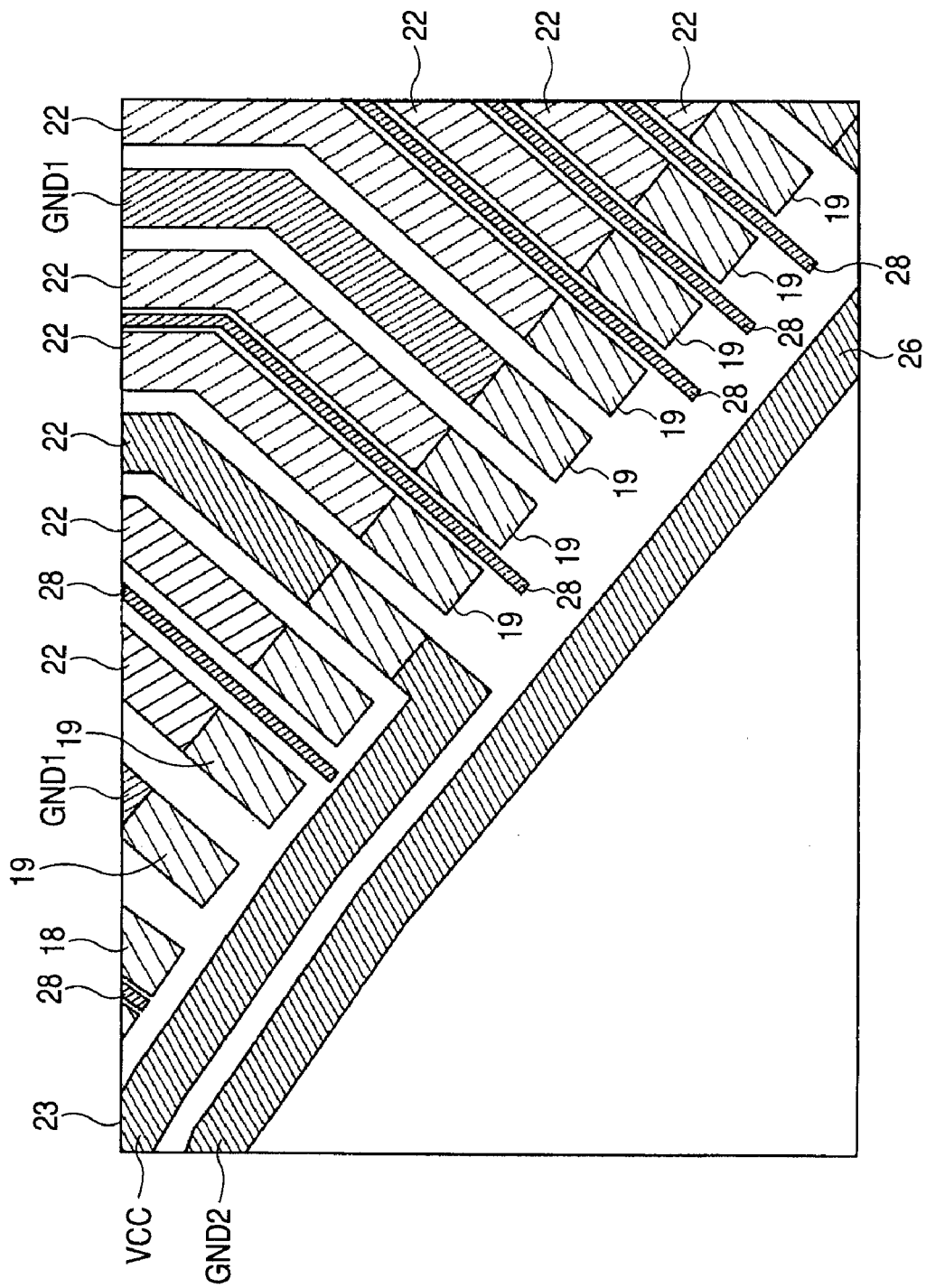
FIG. 5 is a principal part enlarged view of the interposer chip shown in FIG. 4.

FIG. 5 is a principal part enlarged view of interposer chip 7. In FIG. 5, shielding wire 28 for preventing the cross talk between them is formed between two adjoining wirings 22 for signals. The one side end of each shielding wire 28 is projected outside the line which connects the end of bonding pads 18 and 19 (periphery side of chip 7). Hereby, the cross talk between wiring 22 can be prevented more effectively.

Passing through between bonding pads 20 of FIG. 4, and connecting with wiring 25, the another side end (not shown) of each shielding wire 28 receives ground voltage GND1. The line width of shielding wire 28 is thinner than the line width of wiring 22. This is for preventing that the area of interposer chip 7 becomes large, and for maintaining the resistance of wiring 22 small.

When wiring 22 for ground voltage GND1 or GND2 and wiring 22 for supply voltage VCC are formed between two wirings 22 for signals, shielding wire 28 is not formed between two wirings 22 for signals. That is because wiring 22 for ground voltage GND1 or GND2, and wiring 22 for supply voltage VCC also achieve the role of shielding wire 28.

When the cross talk between two wirings 22 for signals which adjoin is small according to the kind of signal, shielding wire 28 may be omitted. However, since the cross talk between wiring 22 for clock signal CLK and wiring 22 for other signals is large, it is necessary to certainly form shielding wire 28 between those wirings 22. That is, for example, in a multimedia card interface etc., the signal from a command pin or a data pin is outputted synchronizing with clock signal CLK given from the host side. So, as compared with other signals, severer timing administration is needed for clock signal CLK. Therefore, microcomputer chip 6 has a circuit for receiving clock signal CLK inputted via wiring 22 for clock signal CLK.

In such a case, even when clock signal CLK is supplied to microcomputer chip 6 via long wiring 22 from the host side, in order to suppress degradation of clock signal CLK, for example, the skew of signal CLK, to the minimum, the pressure up/pressure-lowering operation capability to drive wiring 22 for clock signal CLK are set up comparatively highly. Therefore, when there is wiring 22 for other signals approaching wiring 22 for clock signal CLK, there is a problem that the cross talk which wiring 22 for other signals receives from wiring 22 for clock signal CLK becomes comparatively large. Since the influence of the cross talk given to wiring 22 for other signals is not only great, but it dislikes the skew of an own signal, wiring 22 for clock signal CLK needs to suppress the influence of the cross talk given from wiring 22 for other signals to the minimum. Therefore, it is important measures to form shielding wire 28 between wiring 22 for clock signal CLK and wiring 22 for other signals.

Figure 6:
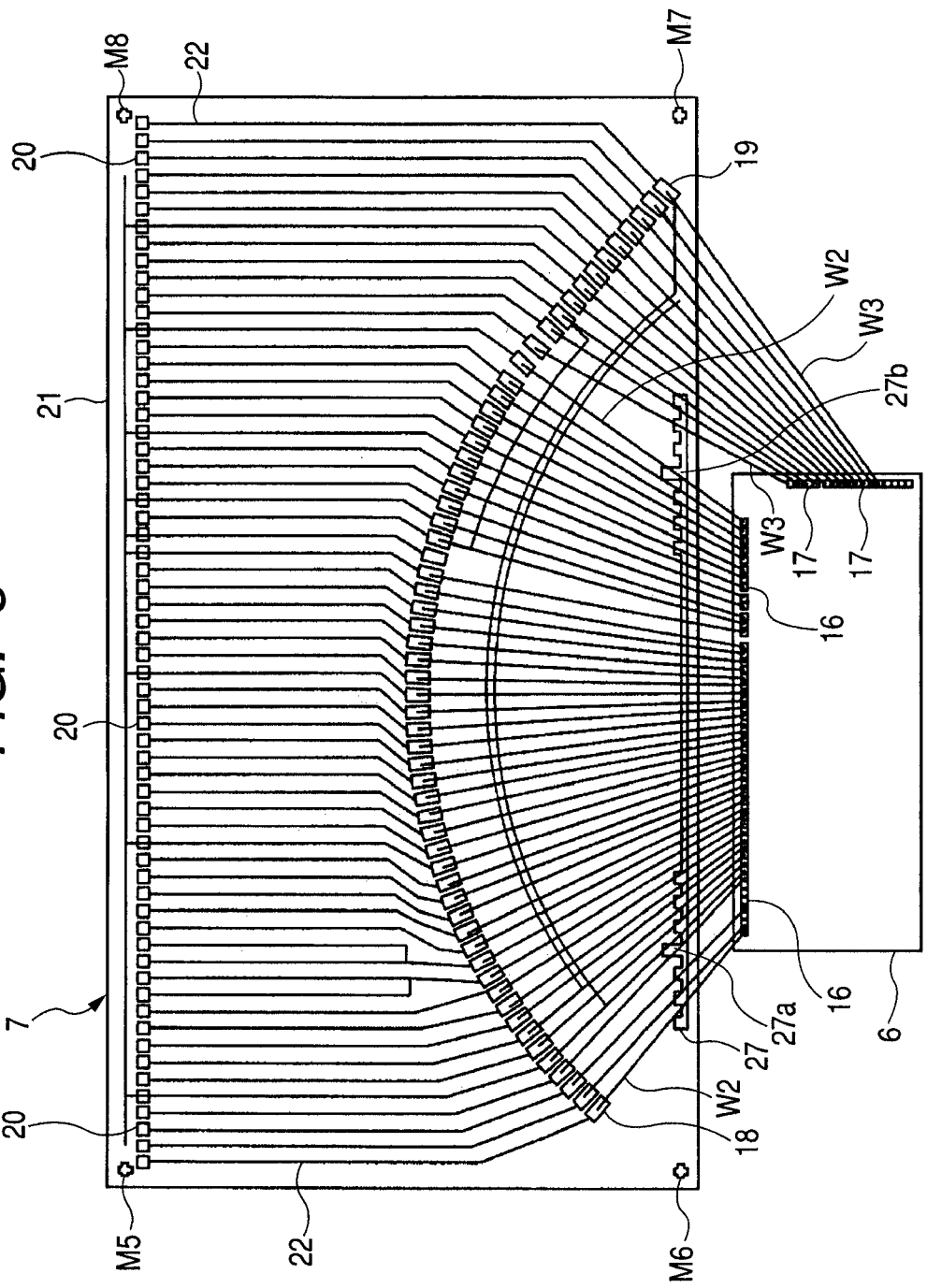
FIG. 6 is an enlarged view showing the microcomputer chip and interposer chip which were shown in FIG. 1.

Marks M5-M8 for alignment are formed in the four corners of silicon substrate 21 front surface, respectively. Mark 27 for visual inspection is formed along one side at the side of microcomputer chip 6 of silicon substrate 21 front surface. Heights 27a and 27b which show the position of the ends of microcomputer chip 6 are formed in mark 27 for visual inspection. As shown in FIG. 6, microcomputer chip 6 is arranged at a position based on the picture photoed by a CCD camera on the basis of marks M5-M8 for alignment formed in the four corners of silicon substrate 21. An operator tests whether microcomputer chip 6 is arranged at the predetermined position on the basis of mark 27 for visual inspection. Alignment marks M5-M8 and mark 27 for visual inspection are formed with the same conductor film as bonding pads 18-20.

Returning to FIG. 1, each bonding pad 16 is connected to corresponding bonding pad 18 by bonding wire W2, each bonding pad 17 is connected to corresponding bonding pad 19 by bonding wire W3, and each bonding pad 20 is connected to corresponding bonding pad 11 by bonding wire W4.

In Embodiment 1, a plurality of bonding pads 18 and 19 for microcomputer chips 6 of interposer chip 7 have been arranged almost circularly. The distance between at least one bonding pad 18 in a plurality of bonding pads 18, and one side at the side of microcomputer chip 6 of interposer chip 7 was made larger than the distance between each bonding pad 19, and one side at the side of microcomputer chip 6 of interposer chip 7. So, the difference of the length of bonding wires W2 and W3 can be made small. Therefore, when liquid resin for sealing is poured in the direction to the upper side from the bottom side in FIG. 1, it can lower the inflow pressure of liquid resin by bonding wire W2, it can make deformation of bonding wire W3 small, and it can prevent that bonding wire W3 contact each other. The difference of the length of adjoining bonding wires can be made small, and a bonding device can be controlled easily.

When a plurality of bonding pads 18 and 19 are made to go along one side at the side of microcomputer chip 6 of interposer chip 7 and it has arranged to one row, bonding wire W3 becomes quite longer than bonding wire W2. Therefore, when resin for sealing is poured in the direction to the upper side from the bottom side in FIG. 1, it will not be able to perform lowering the inflow pressure of resin by bonding wire W2, but the deformation of bonding wire W3 will become large, and bonding wire W3 will contact each other. Since the difference of the length of bonding wires W2 and W3 becomes large, control of a bonding device becomes difficult.

By forming interposer chip 7 between microcomputer chip 6 and wiring substrate 1, the pitch of a pad can be changed and the conditions of bonding are eased. For example, since pitch L4 of bonding pads 16 and 17 is small, an expensive bonding device with high position accuracy needs to perform bonding wire W2 and bonding of W3. However, since pitch L6 of bonding pad 20 is large, the bonding device of a low price with low position accuracy can perform bonding of bonding wire W4 with bonding wire W1. Since bonding wire W4 struck and taken down from chip 7 of the top layer stacked on memory chips 2-5 to bonding pad 11 of wiring substrate 1 which is an undermost layer becomes long, it becomes easy to contact wire W4 which inclines and adjoins. However, contact of wire W3 of each other can be prevented by having changed the minimum pitch of the pad into L6 from L4 with interposer chip 7.

Figure 7:
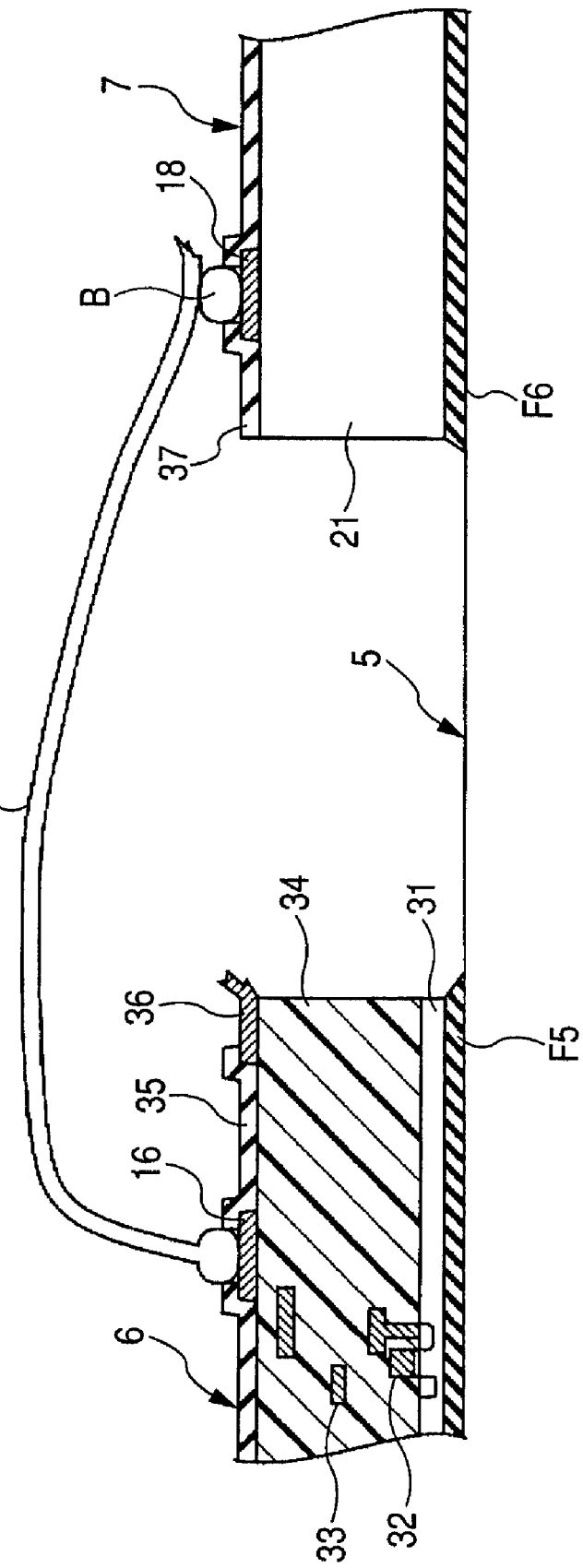
FIG. 7 is a principal part cross-sectional view of the microcomputer chip and interposer chip which were shown in FIG. 1.

By forming interposer chip 7 between microcomputer chip 6 and wiring substrate 1, even when the electrically conductive burr resulting from TEG etc. exists in the end face of microcomputer chip 6, it can prevent that bonding wire W2 and W3 contact the electrically conductive burr of the end face of microcomputer chip 6. That is, microcomputer chip 6 forms MOS transistor 32, wiring layer 33, insulating layer 34, bonding pad 16, covering layer 35, etc. in the front surface of silicon substrate 31, as shown in FIG. 7. The surface central part of bonding pad 16 is exposed without being covered by covering layer 35. As mentioned above, electrically conductive burr 36 is exposed to the end face of microcomputer chip 6. Although electrically conductive burr 36 is not restricted to this, it originates in the bonding pad for TEG currently formed, for example so that the end face of microcomputer chip 6 might be straddled. The back surface of silicon substrate 31 is being fixed to the front surface of memory chip 5 via adhesive film F5.

Interposer chip 7 forms bonding pad 18 etc. in the front surface of silicon substrate 21 by an one-layer wiring layer, and forms covering layer 37 on it. The surface central part of bonding pad 18 is exposed without being covered by covering layer 37. Gold ball B which cut the leading edge of bonding wire W2, and was formed is joined to the front surface of bonding pad 18, and gold ball B is connected with bonding pad 16 by bonding wire W2. The back surface of silicon substrate 21 is being fixed to the front surface of memory chip 5 via adhesive film F6.

Burr 26 does not exist in the end face of interposer chip 7. As for interposer chip 7, it is preferred to have structure without an active element. By having simple structure without an active element, the reliability of interposer chip 7 can be improved and it becomes easy to have structure without TEG for testing an electrical property. When it is a chip without TEG, it will become easier to have structure that a wiring pattern (burr 26) does not expose to a chip end face. The manufacturing cost of interposer chip 7 is reducible by having structure without an active element. As for wirings 22-26 of interposer chip 7 etc., it is preferred to have structure which is not exposed to the end face of interposer chip 7. Even when interposer chip 7 has a multilayer wiring layer, it is more preferred to have structure that the wiring formed of a conductive member does not expose to the end face of interposer chip 7.

Since microcomputer chip 6 was adjoined and interposer chip 7 has been arranged in the same height, when forming the loop of bonding wire W2 and W3 above the end face of microcomputer chip 6, it becomes easy to secure the distance of bonding wire W2, and W3 and microcomputer chip 6 end portion. Therefore, even when the electrically conductive burr resulting from TEG etc. exists in the end face of microcomputer chip 6, it can prevent that bonding wire W2 contacts the electrically conductive burr of the end face of microcomputer chip 6. As for wire W4 which strikes and takes down a big level difference, it becomes comparatively difficult at the time of formation of a wire loop to secure distance with the end portion of interposer chip 7. However, since an electrically conductive burr does not exist in the end face of interposer chip 7 by having structure that an electrically conductive wiring does not expose to the end face of interposer chip 7, even if bonding wire W4 contacts the end face of interposer chip 7, the unnecessary short-circuit of wire W4, and the wiring in interposer chip 7 can be prevented.

As shown in FIG. 2, wiring substrate 1 forms wiring layer 1b in the front surface of substrate 1a, and forms wiring layer 1c in the back surface of substrate 1a. A plurality of solder bumps BP are formed in the back surface of wiring substrate 1. The wiring of a large number is formed in wiring layers 1a and 1b, and each solder bump BP is connected to corresponding bonding pad 10 and/or 11 via the wiring. A plurality of solder bumps BP are arranged at matrix form, and form the external connection terminal group. This semiconductor device includes BGA (Ball Grid Array) structure, and is mounted in the mother board of a portable device like a portable telephone via a plurality of solder bumps BP.

Figure 8:
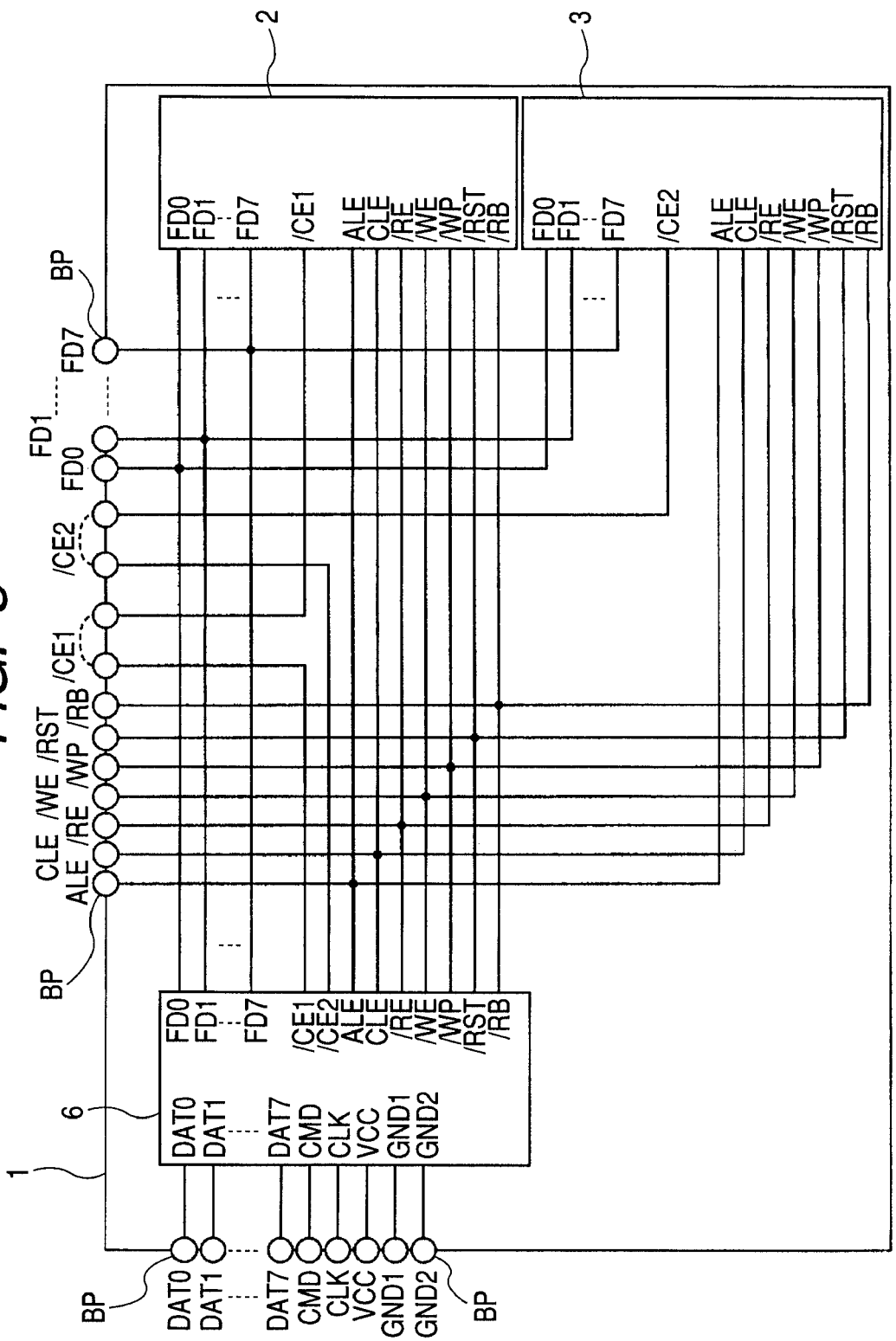
FIG. 8 is a circuit block picture showing the structure of the semiconductor device shown in FIG. 1.

FIG. 8 is a block diagram showing the connecting relation of a plurality of solder bumps BP, microcomputer chip 6, and memory chips 2 and 3. Two memory chips 2 and 3 of four memory chips 2-5 are shown for simplification of a drawing.

Solder bump BP connected to the input terminal for chip enable signal /CE1 of memory chip 2 and solder bump BP connected to the output terminal for chip enable signal /CE1 of microcomputer chip 6 are adjoined and formed in the back surface of wiring substrate 1. Solder bump BP connected to the input terminal for chip enable signal /CE2 of memory chip 3 and solder bump BP connected to the output terminal for chip enable signal /CE2 of microcomputer chip 6 are adjoined and formed in the back surface of wiring substrate 1.

The input output terminals for data signal FD0~FD7 and the input terminals for signal ALE, CLE, /RE, /WE, /WP, /RST, /RB of memory chips 2 and 3 are directly connected to the input output terminals for data signal FD0~FD7 and the output terminals for signal ALE, CLE, /RE, /WE, /WP, /RST, /RB of microcomputer chip 6, respectively.

Here, the terminal block of signal FD0~FD7 is used for the input/output of stored data, the input of address data, and the input of command data. Signals /CE1 and /CE2 are the signals for activating memory chips 2 and 3, respectively. Signal ALE is a signal for specifying signals FD0-FD7 as address data. Signal CLE is a signal for specifying signals FD0-FD7 as command data. Signal /RE is a signal for reading stored data. Signal /WE is a signal for writing in data. Signal /WP is a signal for forbidding an erase, a program, and a rewrite. Signal /RST is a signal for initializing a semiconductor device. Signal /RB is a signal which shows the ready/busy condition of a semiconductor device.

A total of 15 solder bumps BP for signal FD0~FD7, ALE, CLE, /RE, /WE, /WP, /RST, /RB are formed in the back surface of wiring substrate 1 common to memory chips 2 and 3. Each solder bump BP is connected to the wiring for transmitting a corresponding signal.

In the back surface of wiring substrate 1, eight solder bumps BP connected to the input terminal of data signals DAT0-DAT7 of microcomputer chip 6, respectively, two solder bumps BP connected to the input terminal of signal CMD and CLK, respectively and three solder bumps BP connected to the input terminal of power-supply-potential VCC and grounding potential GND1 and GND2, respectively are formed.

Before a semiconductor device is shipped, the test of whether each of memory chips 2 and 3 is normal is done. When microcomputer chip 6 is set to the test mode which is the mode in which the electric test of microcomputer chip 6 is done, the output state from microcomputer chip 6 is as follows. Both the output terminals for chip enable signal /CE1, /CE2 are made into the "H" level of a deactivation level. The terminals for signal FD0~FD7, ALE, CLE, /RE, /WE, /WP, /RST, /RB are made into a hi-z state.

When a microcomputer chip is what has the mode which controls all the memory chip connection terminals including the output terminal for chip enable signal /CE1, /CE2 to a hi-z state, even if it does not separate the output terminal for signal /CE1, CE2 of microcomputer chip 6, and the input terminal for signal /CE1, /CE2 of memory chips 2 and 3, by setting it as the above-mentioned mode, memory chips 2 and 3 are independently controlled by the input of the signal from solder bump BP which is an external terminal, and can be tested by it. However, in both the test modes of usual microcomputer chip 6, the output terminal for chip enable signal /CE1, /CE2 is made into the "H" level which is a non-activity level. So, in this semiconductor device, the output terminal for signal /CE1, /CE2 of microcomputer chip 6 and the input terminal for signal /CE1, /CE2 of memory chips 2 and 3 are separated, and solder bump BP is formed corresponding to each terminal. Thereby, regardless of the output state of signal /CE1, /CE2 of microcomputer chip 6, it becomes possible to control a memory chip. Therefore, with the signal inputted from solder bump BP which is an external terminal, where microcomputer chip 6 is set as a test mode, memory chips 2 and 3 are controlled independently, and they can be tested now in it.

When controlling memory chip 2 by the signal input from solder bump BP and testing it, two solder bumps BP connected to the input terminal for signal /CE1, /CE2 of memory chips 2 and 3 are made into the "L" level and the "H" level, respectively, and while activating memory chip 2, memory chip 3 is made to deactivate. For example, writing/read-out of the data of each memory transistor of memory chip 2 are performed, and it is tested whether each memory transistor is normal.

When controlling memory chip 3 by the signal input from solder bump BP and testing it, two solder bumps BP connected to the input terminal for signal /CE1, /CE2 of memory chips 2 and 3 are made into the "H" level and the "L" level, respectively, and while activating memory chip 3, memory chip 2 is made to deactivate. For example, writing/read-out of the data of each memory transistor of memory chip 3 are performed, and it is tested whether each memory transistor is normal. A defective memory transistor is replaced, for example by the memory transistor of a spare. When it cannot replace, a semiconductor device is discarded as a defective unit.

Figure 9:
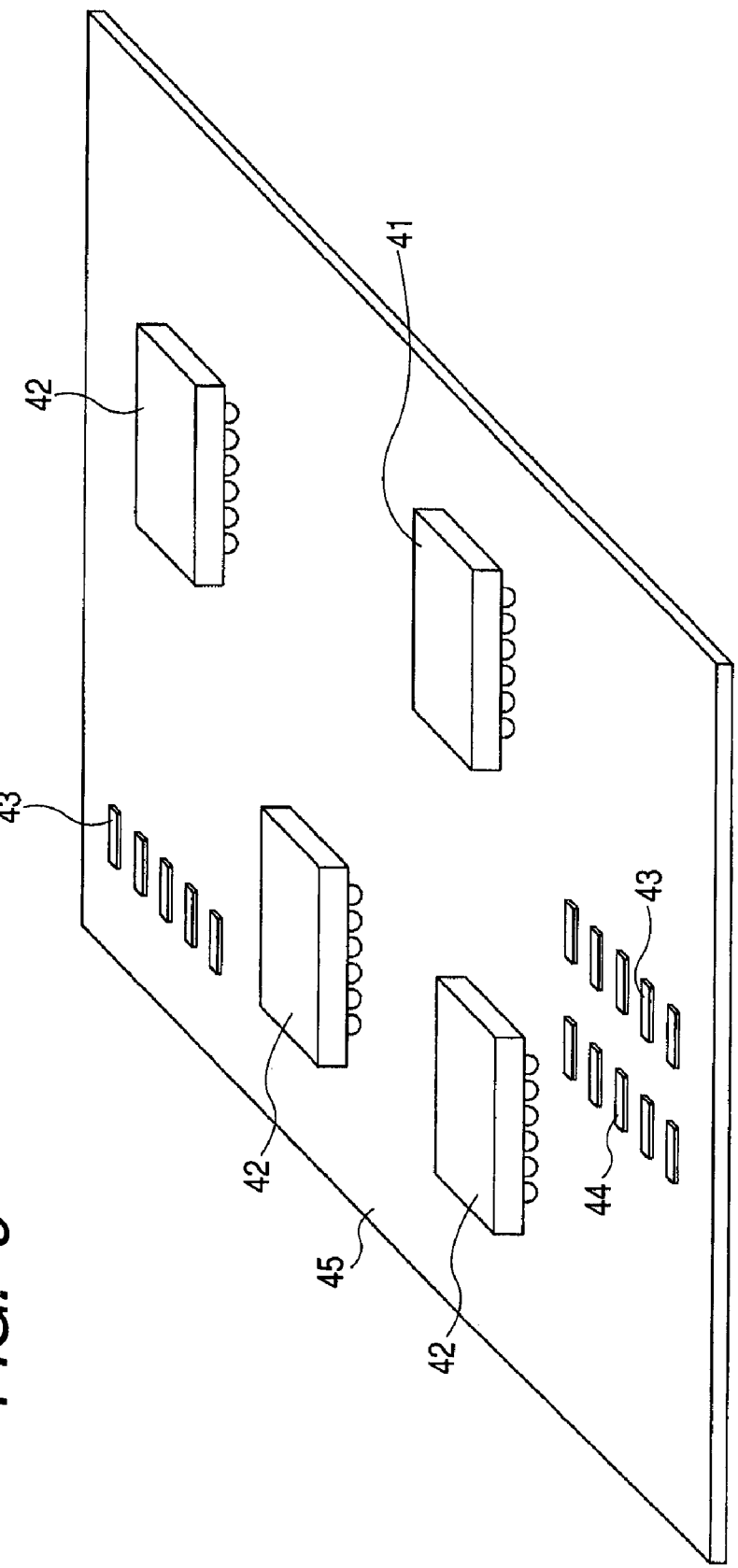
FIG. 9 is a drawing showing the state where the semiconductor device shown in FIG. 1 was mounted in the mother board.

Semiconductor device 41 which passed the test is shipped, as shown in FIG. 9, it is mounted, for example in mother board 45 of a portable telephone with other LSI chips 42, resistor element 43, capacitative element 44, etc., and it is used as a substitute of a memory card. In this embodiment, it is mounted by doing reflow of the solder bump BP and joining to the electrode on mother board 45. Although a memory card has a possibility that a copy of data may be performed unjustly, since this semiconductor device 41 is fixed in a portable telephone by the metal junction through solder bump BP, there is no such fear. To use a memory card, it is necessary to form the slot for inserting a memory card in a portable telephone. However, since it becomes unnecessary to have such a slot when using this semiconductor device 21, the miniaturization of a portable telephone can be aimed at.

Solder bump BP connected to the input terminal for signal /CE1 of memory chip 2 and solder bump BP connected to the output terminal for signal /CE1 of microcomputer chip 6 are connected with the wiring of mother board 45. Solder bump BP connected to the input terminal for signal /CE2 of memory chip 3 and solder bump BP connected to the output terminal for signal /CE2 of microcomputer chip 6 are connected with the wiring of mother board 45. In FIG. 8, the dashed line shows the connecting relation by the wiring of these mother boards 45. Since one pair each of solder bumps BP adjoin and are arranged, they can connect one pair of solder bump BP(s) easily by arranging the electrode of the size which can mount one pair of adjoining solder bumps BP, for example on mother board 45.

Embodiment 2

As FIG. 2 showed, in this semiconductor device, wiring substrate 1, memory chips 2-5, microcomputer chip 6, and interposer chip 7 are being mutually fixed with adhesive films F1-F6.

Figure 10A:
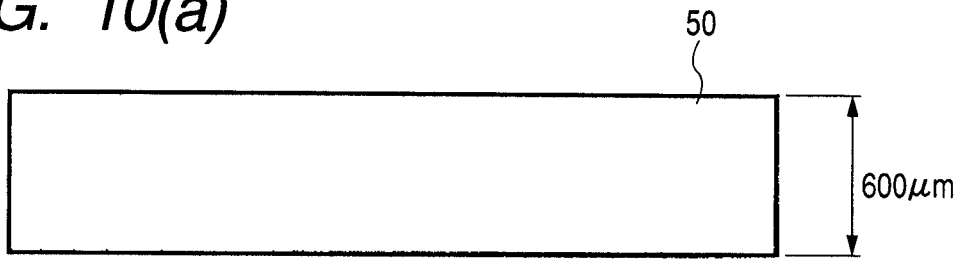
FIGS. 10A to 10E are drawings explaining a manufacturing method of a semiconductor device in Embodiment 2 of this invention.
Figure 10B:
Figure 10C:
Figure 10D:
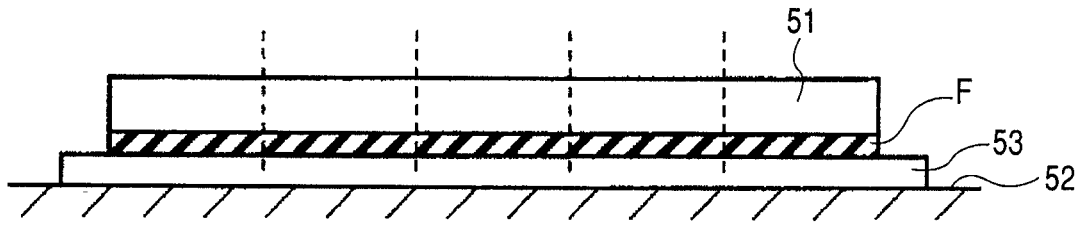
Figure 10E:

FIGS. 10A to 10E are drawings showing the step which sticks adhesive film F1 on the back surface of memory chip 2. First, as shown in FIG. 10A, a plurality of memory circuits are formed in the front surface of silicon wafer 50 of thickness 600 μm at matrix form. Next, as shown in FIG. 10B, the back surface of silicon wafer 50 is shaved and silicon wafer 51 of thickness 90 μm is produced. Subsequently, as shown in FIG. 10C, adhesive film F is stuck on the whole back surface of silicon wafer 51. Next, as shown in FIG. 10D, dicing tape 53 is stuck on the front surface of stage 52, and silicon wafer 51 is stuck on the front surface via adhesive film F. A dicing blade (not shown) cuts silicon wafer 51 and adhesive film F vertically and horizontally, and a plurality of memory chips 2 in which each includes one memory circuit are produced. Each memory chip 2 is removed from dicing tape 53 together with adhesive film F1, and as FIG. 2 shows, it sticks on the front surface of wiring substrate 1. The same may be said of the method of sticking adhesive films F2-F6 on other memory chips 3, 4, and 5, microcomputer chip 6, and interposer chip 7.

Here, when the adhesive strength of adhesive films F1-F6 is too small, the position of microcomputer chip 6 with a small adhesion area or interposer chip 7 will shift at the time of connection of bonding wire W2 and W3 etc. On the contrary, when the adhesive strength of adhesive films F1-F6 is too large, there is a problem that memory chips 2-5 with a big adhesion area break when removing from dicing tape 53.

So, in this Embodiment 2, what has small adhesive strength with dicing tape 53 is used as adhesive films F1-F4, and what has bigger adhesive strength than adhesive films F1-F4 is used as adhesive film F5 and F6. Thus, while preventing the crack of memory chips 2-5 by using an adhesive film properly according to a chip size, a position drift of microcomputer chip 6 and interposer chip 7 can be prevented. As adhesive film F5 and F6 with big adhesive strength, what has a big rate of a thermosetting non-hardened binder can be used, for example as compared with films F1-F4 with small adhesive strength. That is, after doing temporary adhesion of microcomputer chip 6 and the interposer chip 7 according to adhesive power on memory chip 5 using adhesive film F5 and F6 with a big rate of a thermosetting non-hardened binder, adhesive film F5 and F6 is heated and the hardening reaction of a thermosetting binder is advanced. Hereby, microcomputer chip 6 and interposer chip 7 can be pasted up sufficiently firmly on memory chip 5, and a position drift of small microcomputer chip 6 and interposer chip 7 can be prevented effectively.

As adhesive films F1-F4 with small adhesive strength, for example as compared with film F5 and F6 with big adhesive strength, the rate of a thermosetting non-hardened binder is small and what has a big rate of thermoplastic resin can be used. By making the rate of a thermosetting non-hardened binder small and enlarging the rate of thermoplastic resin, at the time of the picking-up step which separates memory chips 2-5 from dicing tape 53, adhesive power of the interface of adhesive films F1-F4 and dicing tape 53 can be made low, and the stress concerning memory chips 2-5 can be made small. As a thermosetting binder, an epoxy system binder can be used, for example. As thermoplastic resin, polyimide system resin can be used, for example.

Embodiment 3

As FIG. 2 showed, in this semiconductor device, memory chips 2-5 of four sheets are loaded into the front surface of wiring substrate 1, microcomputer chip 6 and interposer chip 7 are mounted in the front surface of memory chip 5, and these are being mutually fixed with adhesive films F1-F6. For this reason, there is a problem that thickness is large in this semiconductor device. Then, it tried to make thickness of a semiconductor device small by making below 10 μm thickness of adhesive films F1-F6 which were about 20 μm conventionally. However, irregularity of about 6-10 μm is shown in the front surface of wiring substrate 1, and in adhesive film F1 of thickness 10 μm, the irregularity cannot be absorbed but a void remains between the under surface of adhesive film F1, and the front surface of wiring substrate 1. In making below 10 μm thickness of adhesive film F1 pasted up on wiring substrate 1, wiring substrate 1 that the difference of the average height on the front surface of a solder resist layer formed on wiring layer 1b and the average height on the front surface of a solder resist layer formed on the region between wiring layers 1b becomes below 5 μm among wiring substrate 1 front surfaces is adopted. Hereby, the void between the under surface of adhesive film F1 and wiring substrate 1 front surface can be lost or reduced even on a satisfactory level.

Figure 11:
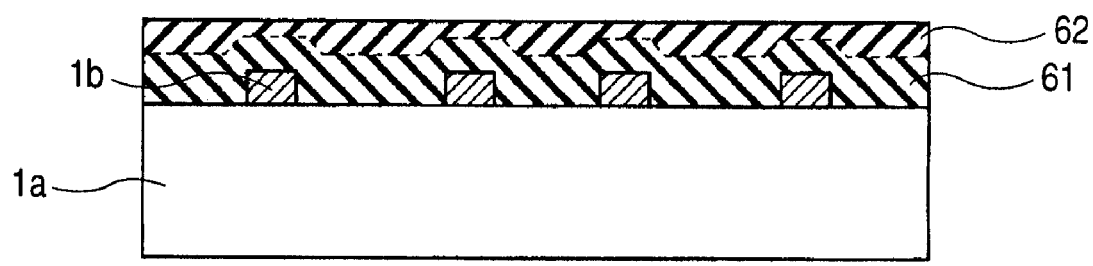
FIG. 11 is a cross-sectional view for explaining the manufacturing method of the semiconductor device by Embodiment 3 of this invention.

So, in this Embodiment 3, as shown in FIG. 11, the front surface of wiring substrate 1 is made to apply and cure liquid solder resist, and solder resist layer 61 of the 1st layer is formed. Then, applying liquid solder resist to the front surface of solder resist layer 61 again, it is made to cure it, and solder resist layer 62 of the 2nd layer is formed. Although irregularity of 5-10 μm remained only by forming solder resist layer 61 of the 1st layer, irregularity was set to 3-5 μm when solder resist layer 62 of the 2nd layer was formed. When memory chip 2 is stuck on the front surface of solder resist layer 62 of the 2nd layer via adhesive film F1 of thickness 10 μm, irregularity of solder resist layer 62 front surface of the 2nd layer is absorbed with adhesive film F1, and the void between the under surface of adhesive film F1 and solder resist layer 62 front surface decreased even to the satisfactory level.

Figure 12:
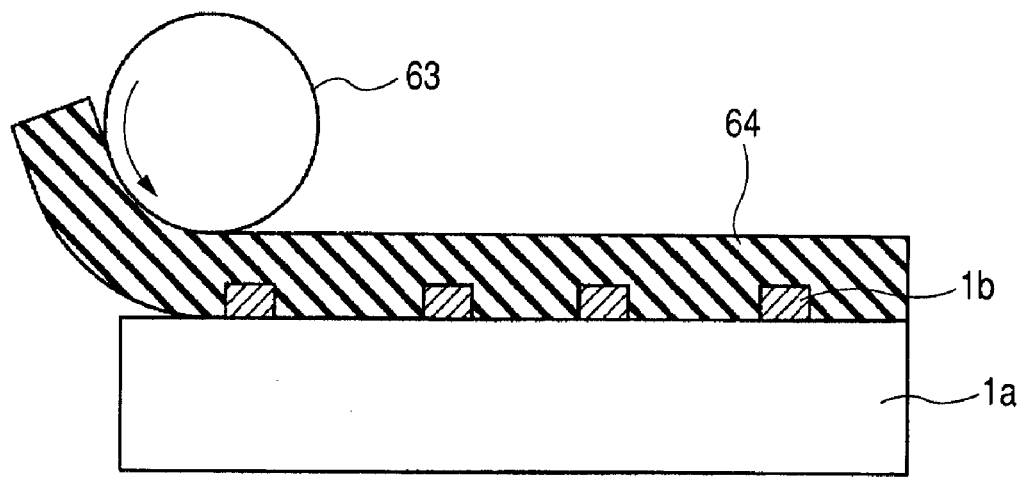
FIG. 12 is a cross-sectional view showing the example of change of Embodiment 3.

FIG. 12 is a drawing showing the example of change of this Embodiment 3. In FIG. 12, with roller 63, dry film resist 64 was rolled on the front surface of wiring substrate 1, and the resist layer was formed in it in this example of change. Irregularity of the resist layer surface was set to 3-5 μm. When memory chip 2 was stuck on the front surface of a resist layer via adhesive film F1 of thickness 10 μm, the void between the under surface of adhesive film F1 and a resist layer surface was reduced by even the satisfactory level.

Embodiment 4

Figure 13:
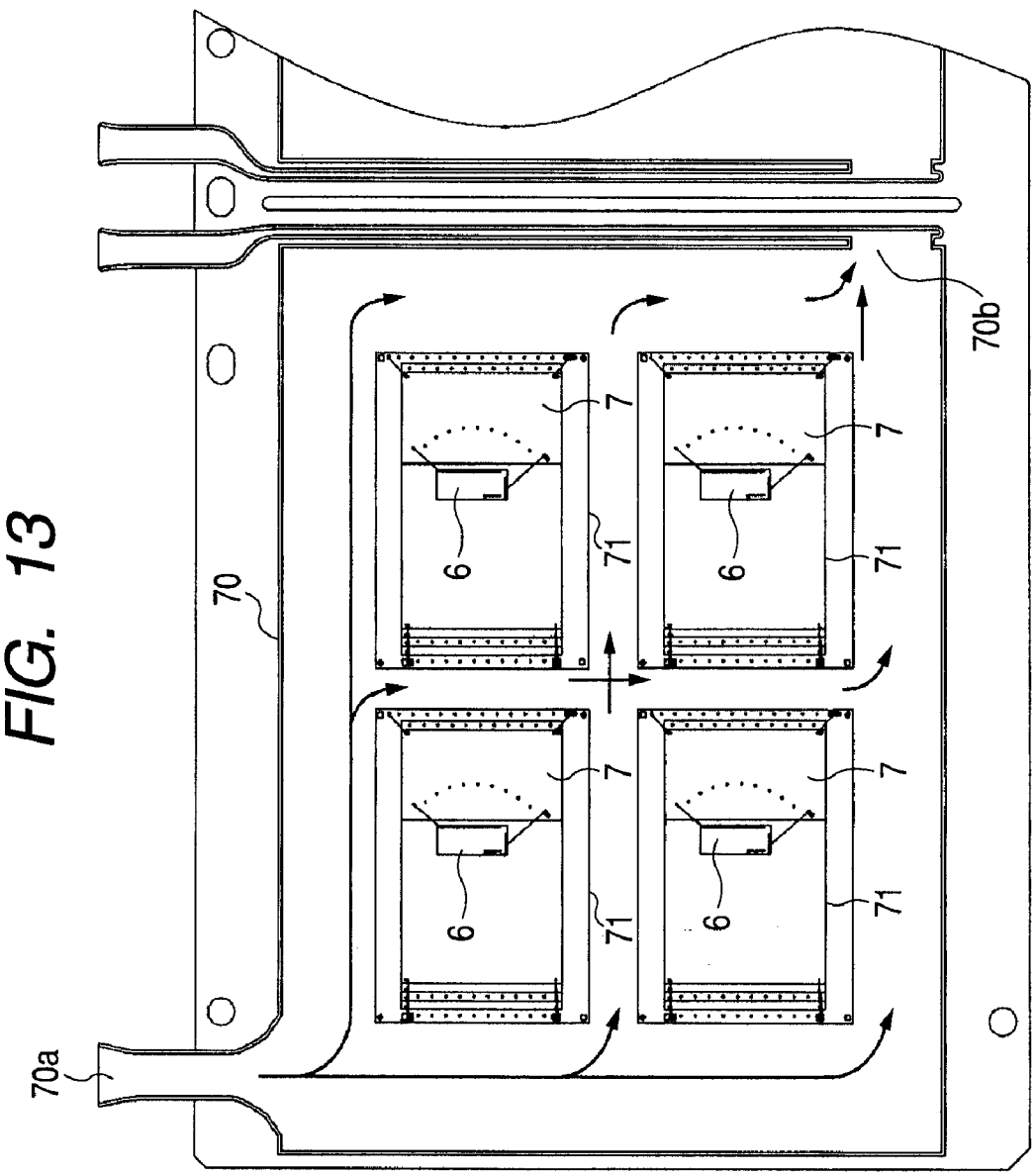
FIG. 13 is a cross-sectional view for explaining the manufacturing method of the semiconductor device by this embodiment of the invention 4.

FIG. 13 is a cross-sectional view by Embodiment 4 of this invention showing a manufacturing method of a semiconductor device. In FIG. 13, semiconductor device 71 of plurality (FIG. 13 four) to which wire bonding ended is arranged by the manufacturing method of this semiconductor device at the bottom of the rectangle of the rectangular parallelepiped-like interior space of mold 70 at plural-rows of plural columns (FIG. 13 two rows of two columns). Each semiconductor device 71 turns the long side in the same direction as the long side of mold 70, makes the interposer chip 7 side the right-hand side in FIG. 13, and is arranged in mold 70. Resin injection opening 70a is formed in the corner at the upper left in FIG. 13 of mold 70, and exhaust port 70b is formed in the corner of the lower right in FIG. 13.

While injecting liquid resin via resin injection opening 70a, when the inside of mold 70 is exhausted via exhaust port 70b, liquid resin as shown in the arrow in FIG. 13 passes along the clearance between semiconductor device 71, and the side wall of mold 70, the clearance between semiconductor devices 71, and the clearance between the front surface side of semiconductor device 71, and the ceiling (not shown) of mold 70, and flows aslant on semiconductor device 71 toward exhaust port 70b from resin injection opening 70a as the whole. After filling up with and curing liquid resin in mold 70, a resin sheet including a plurality of semiconductor devices 71 is picked out from mold 70. When each semiconductor device 71 is separated, as shown in FIG. 2, semiconductor device 71 with which the front surface side was sealed by resin will be completed.

Here, when liquid resin is poured only in the direction of the long side of semiconductor device 71 from the interposer 7 side, memory chips 2-5 will separate from wiring substrate 1 with the transfer pressure of liquid resin. When liquid resin is poured only in the direction of the long side of semiconductor device 71 from the opposite side of the side of interposer 7, between wiring substrate 1, and memory chips 2-5, it will not fully be able to be filled up with liquid resin, but a void will remain. However, in this Embodiment 4, since liquid resin flows aslant on semiconductor device 71, memory chips 2-5 do not separate, or a void does not remain.

Figure 14:
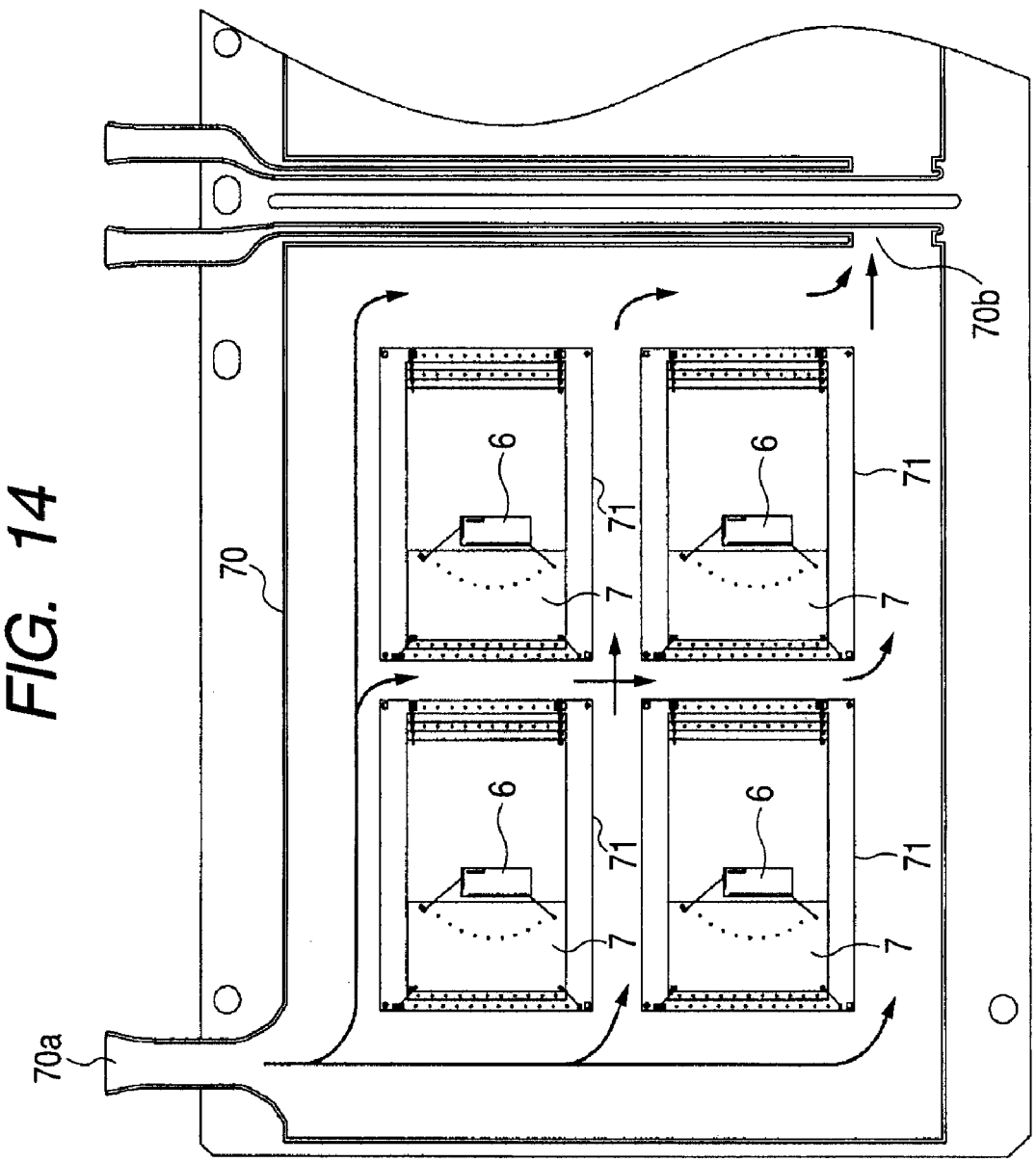
FIG. 14 is a cross-sectional view showing the example of change of Embodiment 4.

As shown in FIG. 14, the long side of each semiconductor device 71 may be turned in the same direction as the long side of mold 70, the interposer chip 7 side of each semiconductor device 71 may be made into the left-hand side in FIG. 14, and it may arrange in mold 70. In this example of change, since liquid resin flows aslant on semiconductor device 71, memory chips 2-5 do not separate, or a void does not remain, either.

Embodiment 5

Figure 15:
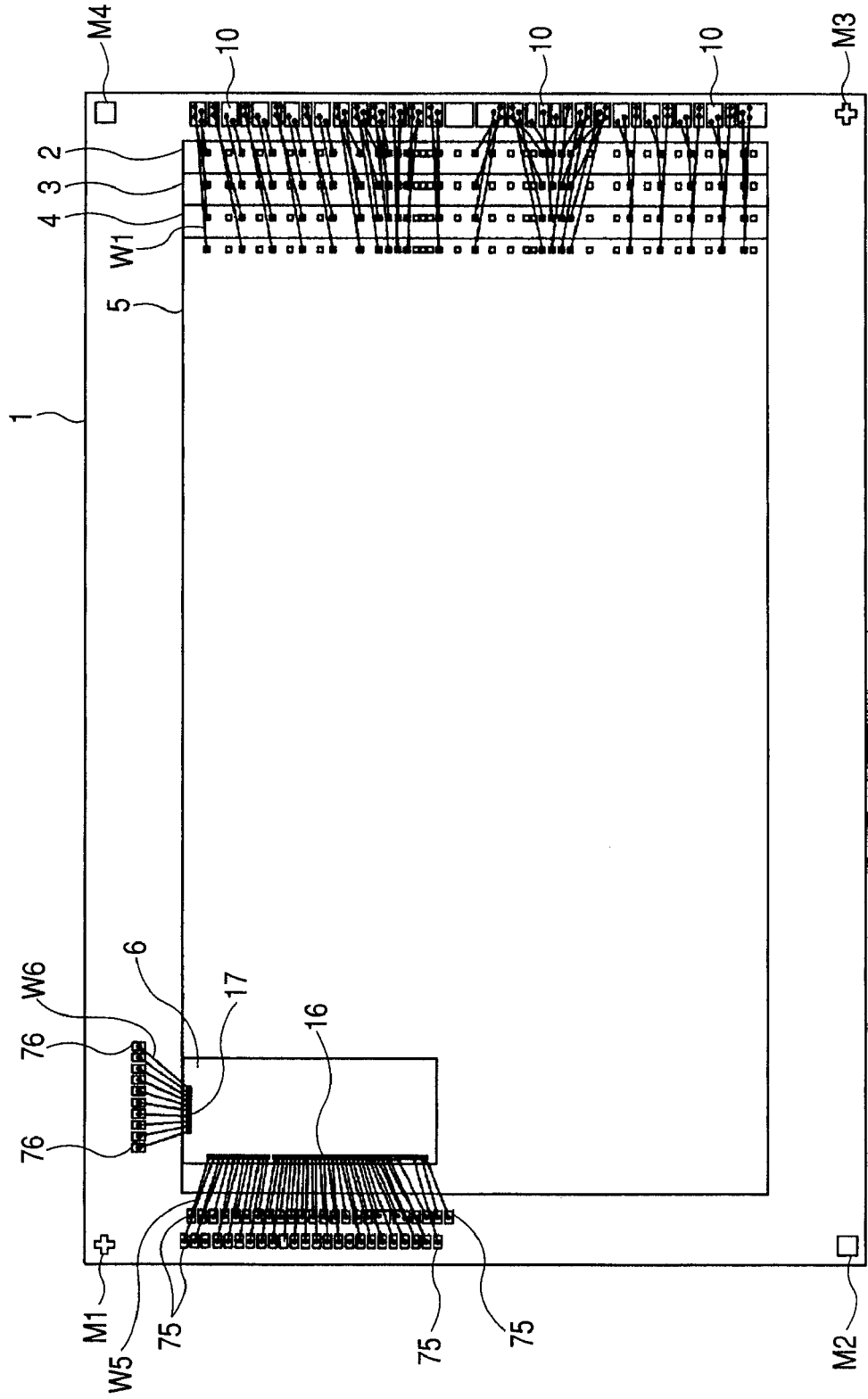
FIG. 15 is a plan view showing the structure of the semiconductor device by Embodiment 5 of this invention.

FIG. 15 is a plan view showing the structure of the semiconductor device by Embodiment 5 of this invention, and is a drawing contrasted with FIG. 1. With reference to FIG. 15, the points that this semiconductor device differs from the semiconductor device of FIG. 1 are the point that interposer chip 7 is removed and microcomputer chip 6 is arranged at the corner of the upper left in a drawing of memory chip 5 front surface, and the point that bonding pad 11 for interposer chip 7 of wiring substrate 1 is removed, and bonding pads 75 and 76 for microcomputer chip 6 are formed.

The short side of microcomputer chip 6 is arranged in piles on the long side of memory chip 5. The long side of microcomputer chip 6 is made parallel the short side of memory chip 5, from the short side of memory chip 5, spaces out only a predetermined distance and is arranged. A plurality of bonding pads 75 are alternately arranged along the long side of microcomputer chip 6 at two rows. A plurality of bonding pads 76 are arranged along the short side of microcomputer chip 16 at one row. Each bonding pad 75 is connected to corresponding bonding pad 16 via bonding wire W5. Each bonding pad 76 is connected to corresponding bonding pad 17 via bonding wire W6.

Figure 16A:
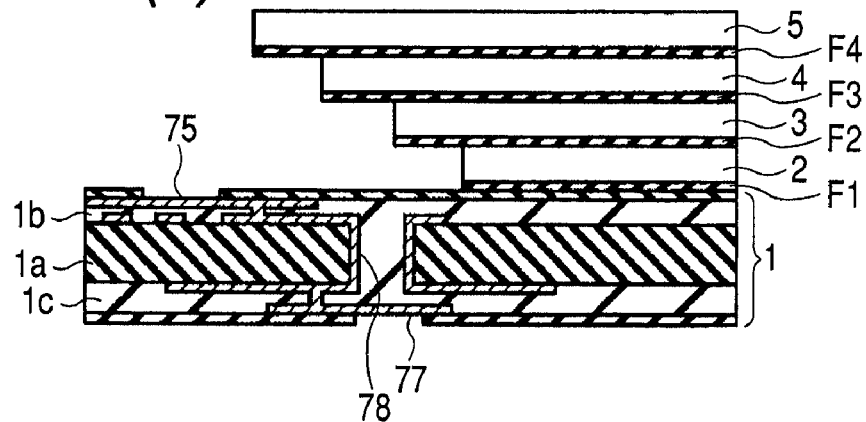
FIGS. 16A to 16C are cross-sectional views showing the manufacturing process of the semiconductor device shown in FIG. 15.

FIGS. 16A to 16C and FIGS. 17A to 17C are cross-sectional views showing the manufacturing process of this semiconductor device. First, as shown in FIG. 16A, memory chips 2-5 can be shifted by prescribed distance on the front surface of wiring substrate 1, and are stacked on it. Adhesive films F1-F4 have pasted the under surface of memory chips 2-5, respectively. Wiring substrate 1 includes substrate 1a and wiring layers 1b and 1c formed in the back and front, respectively. The front surface of wiring layer 1b is covered by the covering layer, and bonding pad 75 is exposed from the opening of a covering layer. The front surface of wiring layer 1c is covered by the covering layer, and pad 77 is exposed from the opening of a covering layer. Pads 75 and 77 are connected via through hole 78.

Figure 16B:
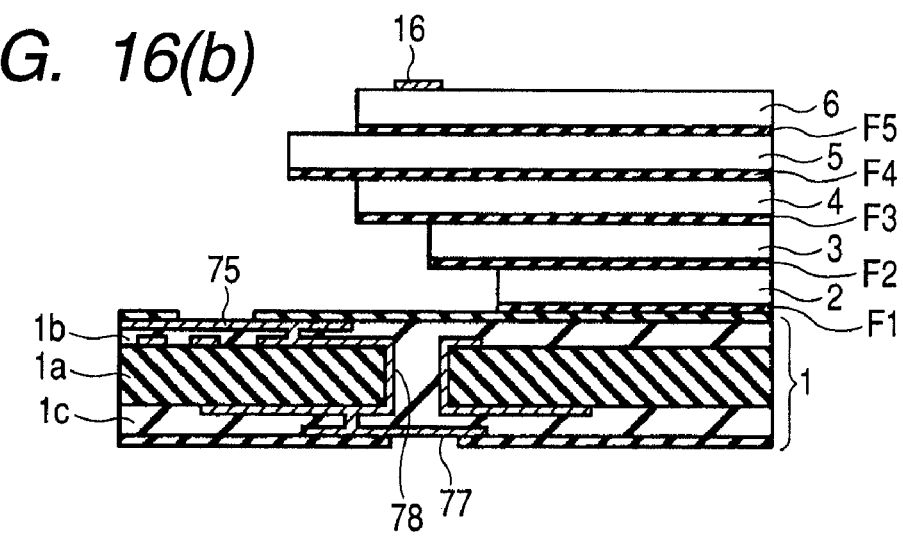

Next, as shown in FIG. 16B, microcomputer chip 6 is stacked via adhesive film F5 at the end portion of memory chip 5 front surface. At this time, microcomputer chip 6 is arranged so that the semiconductor chip (in the drawing, chips 4-6) of three or more sheets may be located under the bonding pads 16 and 17 of microcomputer chip 6. This reason is explained below.

In this semiconductor device, memory chips 3-5 constitute overhang form by which space was formed between wiring substrate 1 front surfaces at the side by which microcomputer chip 6 is arranged. When for example, microcomputer chip 6 is also arranged in overhang form and wire bonding is performed in the state where there is no memory chip under the bonding pad 16 of microcomputer chip 6, microcomputer chip 6 may deform according to the load applied to bonding pad 16 at the time of wire bonding, and a region including bonding pad 16 may sink. Like especially the after-mentioned, when applying a scrub from a capillary to a wire at the time of a wire-bonding step, application of a scrub is not performed by subduction of microcomputer chip 6 properly, but a wire and chip 6 may be damaged by it.

Even when forming the loop of a wire above bonding pad 16 after connecting a wire tip to bonding pad 16, at the time of connection of a wire tip, according to the load applied from a capillary, microcomputer chip 6 may do elastic deformation and sink. Then, at the time of wire loop formation, when deformation of microcomputer chip 6 does elastic recovery according to application of the load from a capillary being lost, the position of bonding pad 16 may change dynamically and may have a bad influence on the form of a wire loop.

When such a problem is taken into consideration, it is most preferred to arrange bonding pad 16 on a portion without the overhang inside the region where memory chips 3-5 end portion overhung, when preventing subduction of microcomputer chip 6 at the time of wire bonding. However, in this semiconductor device, the distance from the end of memory chip 5 to a portion without an overhang is as large as 1.38 mm. When bonding pad 16 of microcomputer chip 6 is arranged so that a part for an over hang may be avoided, the length of wire W5 will become large. Then, microcomputer chip 6 is arranged under the bonding pad 16 to the region to which the total thickness of the semiconductor chip stuck via adhesive film F becomes more than 200 μm.

Hereby, even when the overhang is formed under bonding pad 16, subduction of microcomputer chip 6 at the time of wire bonding can be reduced effectively, and the manufacturing trouble of a semiconductor device can be reduced sufficiently. In Embodiment 5, since the thickness of each memory chip is 90 μm, when arranging bonding pad 16 of microcomputer chip 6 to the region where two or more memory chips paste up under microcomputer chip 6, the total thickness of the semiconductor chip stuck via adhesive film F under the bonding pad 6 can be done to more than 200 μm. In FIG. 16B, memory chips 4 and 5 of two sheets and microcomputer chip 6 exist under the bonding pad 16.

Figure 16C:
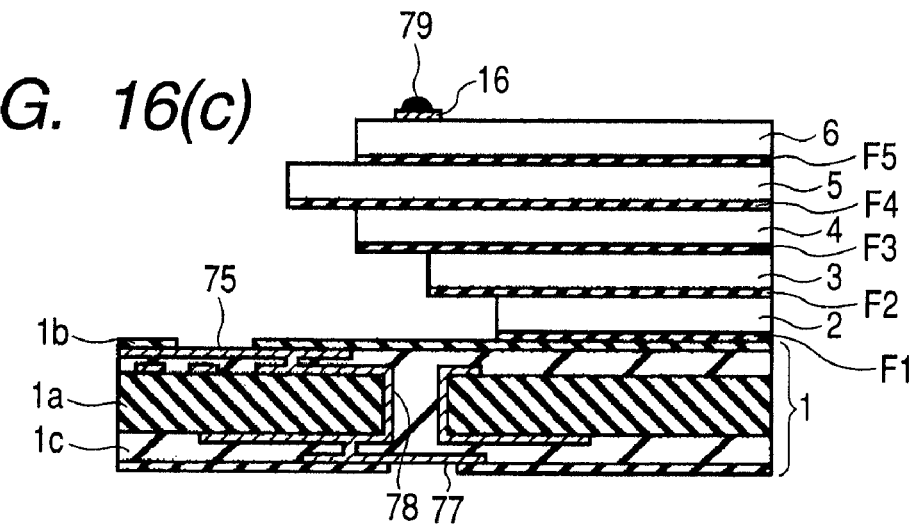
Figure 18A:
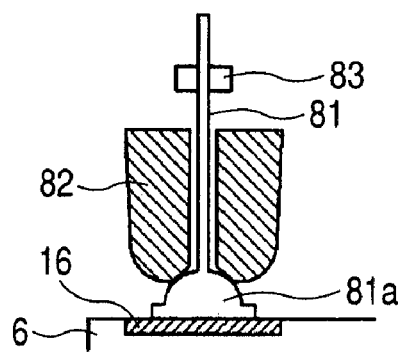
FIGS. 18A to 18D are cross-sectional views showing the formation method of a stud bump shown in FIGS. 16A to 16C.

Next, as shown in FIG. 16C, stud bump 79 is formed on bonding pad 16 of microcomputer chip 6. FIGS. 18A to 18D are drawings showing the formation method of stud bump 79. First, as shown in FIG. 18A, ball part 81a formed at bonding wire 81 tip is joined on bonding pad 16 of microcomputer chip 6. At this ball-bonding step, ball part 81a can be joined to pad 16 better by giving heat from a stage and applying load and an ultrasonic wave from capillary 82. The maximum load applied to ball part 81a from capillary 82 at the time of ball bonding is 30 gf. In Embodiment 5, as mentioned above, since the total thickness of the semiconductor chip stuck via adhesive film F under the bonding pad 16 is done more than 200 μm, the elastic deformation of microcomputer chip 6 by the load at the time of ball bonding is suppressed by the sufficiently low level.

Figure 18B:
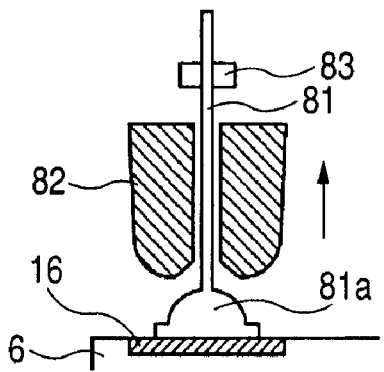
Figure 18C:
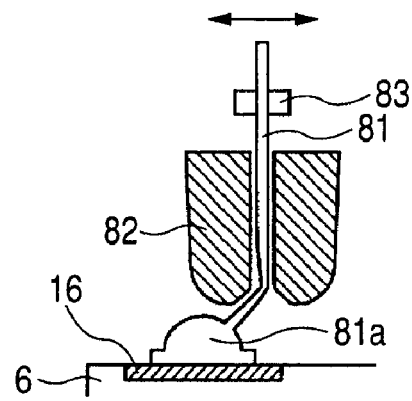

Next, as shown in FIG. 18B, capillary 82 is raised 15 μm above ball part 81a. Subsequently, as shown in FIG. 18C, by doing reciprocation operation of the capillary 82 to right and left, a scrub is applied to bonding wire 81 and the strength when cutting bonding wire 81 is reduced. The amplitude of capillary 82 of operation is done at least to more than the clearance between bonding wire 81, and the inner wall of capillary 82.

Since the diameter of bonding wire 81 is 23 μm and the inside diameter of capillary 82 is 30 μm concretely, the clearance between both is 3.5 μm at one side, when it is averaged, and when both sides are added, it is 7 μm. In order for the inner wall of capillary 82 to contact bonding wire 81 and to apply stress to bonding wire 81, it is necessary to do the amplitude of reciprocating movement of capillary 82 for every one side at the lowest more than the clearance between capillary 82 inner wall and bonding wire 81. Concretely, capillary 82 needs to be moved more than 3.5 μm to one side, and more than 7 μm as amplitude of reciprocating movement. In order to give sufficient stress for the tail cut part of bonding wire 81 and to reduce cut strength, it is preferred to make it operate more than double of the clearance between capillary 82 inner wall and bonding wire 81. That is, it is more preferred to operate capillary 82 more than 7 μm in one side, and more than 14 μm as amplitude of reciprocation operation.

Figure 18D:
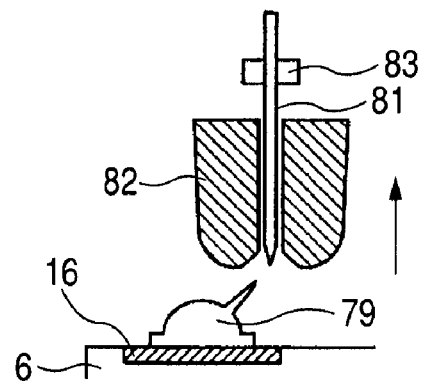

Next, as shown in FIG. 18D, bonding wire 81 is cut in the upper part of ball part 81a by raising clamper 83 and capillary 82, where wire 81 is held by clamper 83. In Embodiment 5, the minimum pitch (minimum distance of the centers of bonding pad 16) of bonding pad 16 of microcomputer chip 6 is very as small as 50 μm, and the diameter of bonding wire 81 which can connect is also restricted. Then, also in thin wire 81, in order to reduce the trouble by the deformation at the time of a resin seal etc., the thing of high elasticity is used as bonding wire 81. The elastic modulus of wire 81 in Embodiment 5 is more than 8000 (kgf/mm2). Thus, before the cutting step of bonding wire 81, when wire 81 with a high elastic modulus is used, as FIG. 18C showed, a scrub is applied and the strength at the time of the cut of bonding wire 81 is reduced. Thereby, the generation of the trouble that wire 81 stored in capillary 82 by the reaction at the time of cutting deforms in a subsequent bonding wire cutting step can be prevented.

Figure 17A:
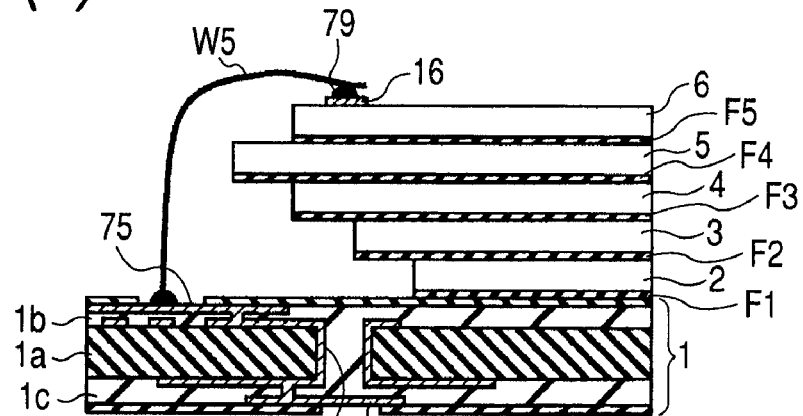
FIGS. 17A to 17C are other cross-sectional views showing the manufacturing process of the semiconductor device shown in FIG. 15.
Figure 17B:
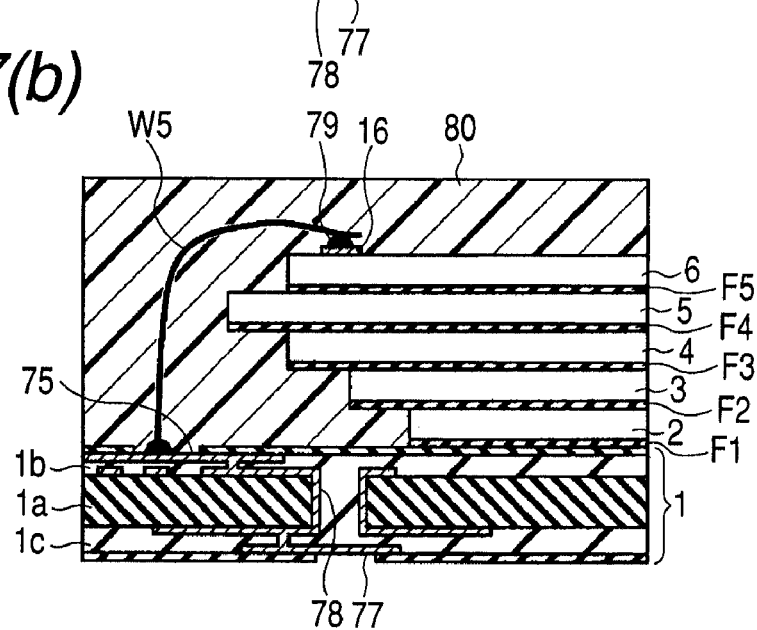

Next, as shown in FIG. 17A, wiring substrate 1 and stud bump 16 are connected by the reverse bonding method. A reverse bonding method is the method of doing stitch bonding (second bonding) of the wire 81 prolonged from ball part 81a on bonding pad 16 of microcomputer chip 6 after doing bonding (first bonding) of the ball part 81a at wire 81 tip to on bonding pad 75 of wiring substrate 1.

FIGS. 19A and 19B, and FIGS. 20A to 20C are drawings showing the reverse bonding method. First, as shown in FIG. 19 (a), ball bonding is performed on bonding pad 75 of wiring substrate 1. In Embodiment 5, microcomputer chip 6 with a narrow pitch of bonding pad 16 and wiring substrate 1 are connected, without an interposer chip between them. On this occasion, when pad 75 row on wiring substrate 1 becomes long too much, the angle of wire W5 to connect may become tight, and the gap between wires W5 cannot be maintained, but wire W5 may contact each other. Therefore, it is preferred to make pad 75 row on wiring substrate 1 become as short as possible. Then, as wiring substrate 1 in Embodiment 5, the wiring substrate which has a build-up wiring layer especially advantageous when forming a fine wiring is used. As for the minimum working dimension of the wiring formed in a build-up wiring layer, the minimum line size is 75 μm and the space between the minimum lines constitutes 75 μm. Pad 75 queue length can be shortened more by arranging pad 75 on wiring substrate 1 to two rows alternately.

Figure 19A:
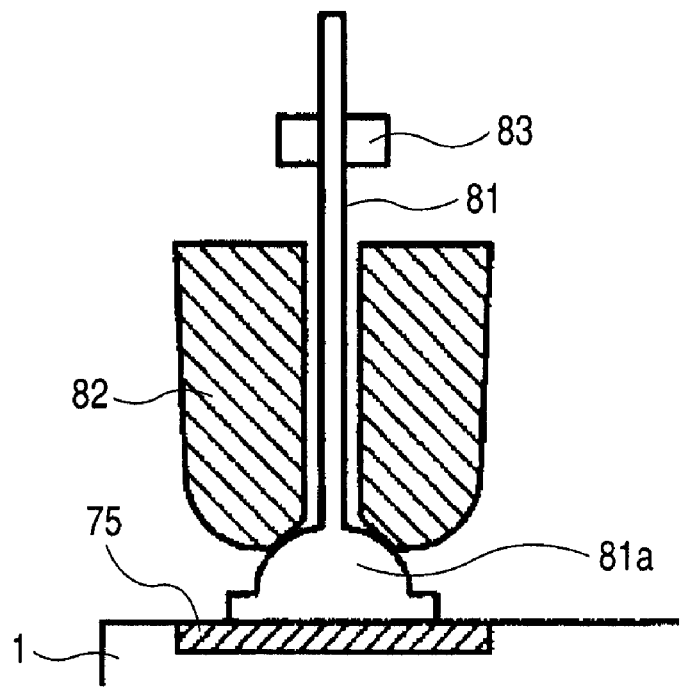
FIGS. 19A and 19B are cross-sectional views showing the ball-bonding method shown in FIGS. 17A to 17C.
Figure 19B:
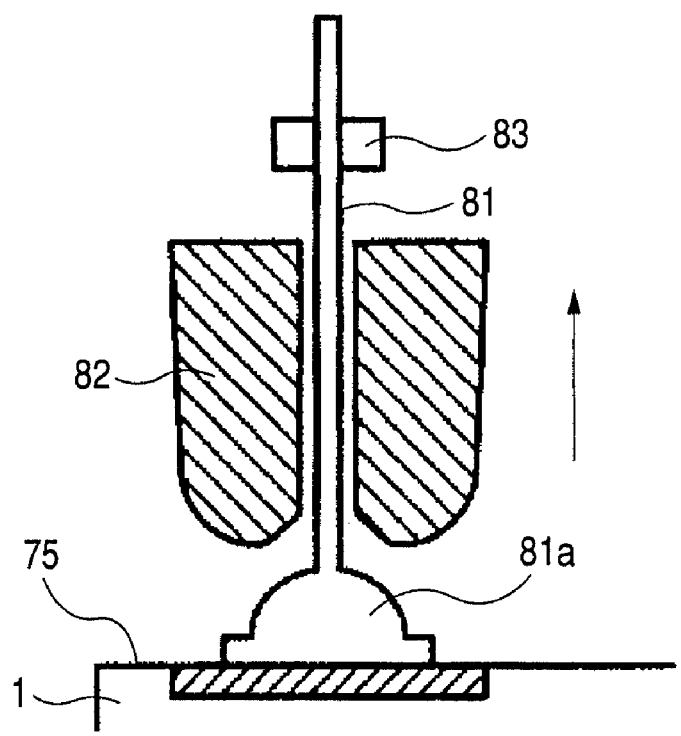
Figure 20A:
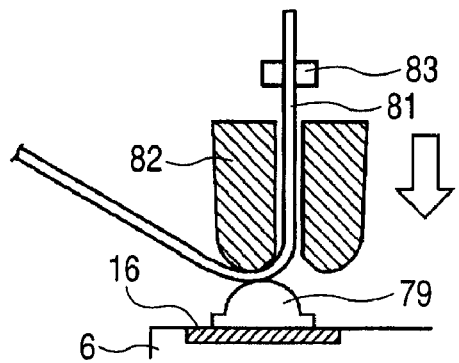
FIGS. 20A to 20D are cross-sectional views showing the stitch bonding method shown in FIGS. 17A to 17C.
Figure 20B:
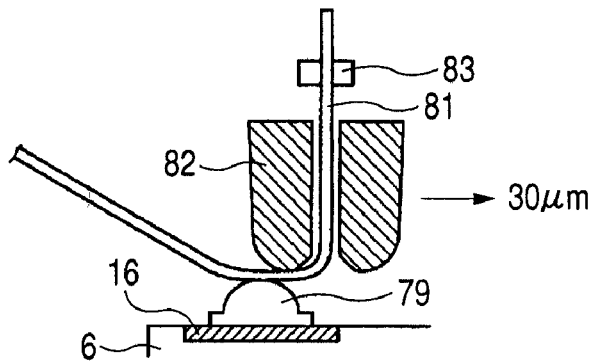

Next, as shown in FIG. 19B, while raising capillary 82, it lets out wire 81 from capillary 82. Subsequently, as shown in FIG. 20A, by capillary 82 tip, load and an ultrasonic wave are applied on stud bump 79, and a part of wires 81 which is let out from capillary 82 are connected. Next, as shown in FIG. 20B, capillary 82 is moved 30 μm from the position which connected wire 81 to stud bump 79. As a movement direction of capillary 82, the extending direction of bonding wire 81 is preferred. As for the movement magnitude of capillary 82, it is preferred that it is the distance more than half of the amplitude of capillary 82 in the scrub step performed later. Thus, it can prevent capillary 82 tip's contacting the connecting part of wire 81 and stud bump 79, and an excessive mechanical burden taking at the time of a scrub step, by moving capillary 82 beforehand.

Figure 20C:
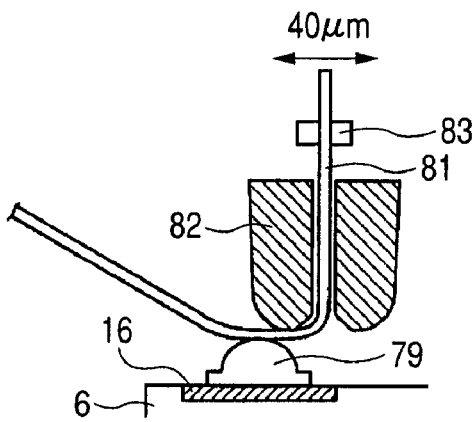

Next, as shown in FIG. 20C, reciprocation moving of the capillary 82 is done with the amplitude of 40 μm, by capillary 82 tip, stress is given to the tail cut part of bonding wire 81, and cut strength is reduced. Like the scrub in the step shown by FIG. 18C as amplitude of the reciprocation moving of capillary 82, it is preferred that it is more than the clearance between bonding wire 81, and the inner wall of capillary 82, and it is more preferred that it is more than double of the clearance between bonding wire 81, and the inner wall of capillary 82.

Figure 20D:
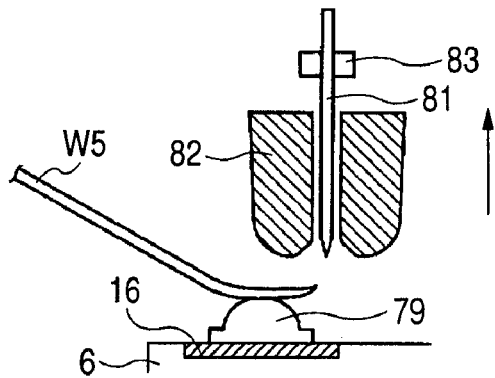

Next, as shown in FIG. 20D, bonding wire 81 is cut in the upper part of ball part 81a by raising clamper 83 and capillary 82, where wire 81 is held by clamper 83. As FIG. 20C showed, since the strength at the time of the cut of bonding wire 81 is reduced applying a scrub, the generation of the trouble that wire 81 stored in capillary 82 by the reaction at the time of cutting deforms in a bonding wire cutting step can be prevented.

Figure 17C:
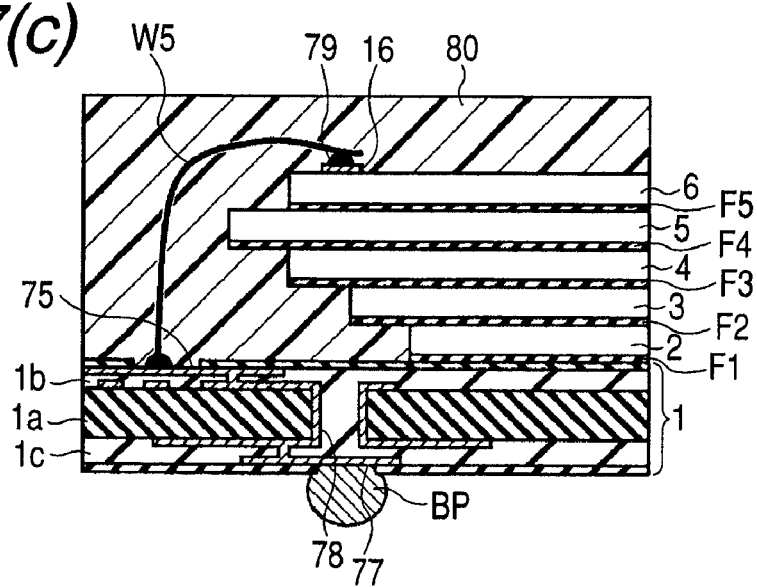

Returning to FIG. 17B, the whole front surface side of a semiconductor device is sealed by resin 80. Hereby, chips 2-6, bonding wire W5, etc. are fixed by resin 80. Finally, as shown in FIG. 17C, solder bump BP is formed in the front surface of pad 77 of the back surface side of wiring substrate 1, and a semiconductor device is completed.

In the above Embodiment 1-5, the case where memory chips 2-5 and microcomputer chip 6 were stacked was disclosed. However, the function of a semiconductor chip is not restricted to these. It cannot be overemphasized that the chip which has various functions, such as various logic chips and a memory chip, can be chosen suitably, and can be combined.

It should be thought that the embodiment disclosed this time is exemplification at all points, and not restrictive. The range of the present invention is not shown by the above-mentioned explanation but shown by a claim. It is meant that all the change of equivalent meaning and in the equivalent range to a claim is included.

What is claimed is:

1. A semiconductor device with which a first chip and a second chip are stacked over a front surface of a wiring substrate, wherein
    an interposer chip is formed over a front surface of the first chip, adjoining the second chip;
    a plurality of first electrodes are arranged along one side of a front surface of the wiring substrate;
    a plurality of second electrodes are arranged along one side of a front surface of the interposer chip, at a side of the first electrodes;
    a plurality of third electrodes are arranged along one side of a front surface of the second chip, at the interposer chip side;
    a plurality of fourth electrodes are arranged along another side of the front surface of the second chip, a projection of which intersects perpendicularly with another side of the interposer chip;
    a plurality of fifth electrodes corresponding to the third electrodes and a plurality of sixth electrodes corresponding to the fourth electrodes are arranged along the front surface of the interposer chip;
    a distance between at least one fifth electrode among the fifth electrodes and the another side of the interposer chip is longer than a distance between the each sixth electrode, and the another side of the interposer chip;
    each third electrode is connected to a corresponding fifth electrode via a bonding wire;
    each fourth electrode is connected to a corresponding sixth electrode via a bonding wire;
    each fifth electrode is connected to a corresponding second electrode via a wiring of the interposer chip;
    each sixth electrode is connected to a corresponding second electrode via a wiring of the interposer chip; and
    each second electrode is connected to a corresponding first electrode via a bonding wire.

2. A semiconductor device according to claim 1, wherein the fifth electrodes and the sixth electrodes are arranged almost circularly.

\* \* \* \* \*